US009052703B2

(12) United States Patent
Cheng et al.

(10) Patent No.: US 9,052,703 B2
(45) Date of Patent: Jun. 9, 2015

(54) ENHANCED SEQUENTIAL METHOD FOR SOLVING PRESSURE/FLOW NETWORK PARAMETERS IN A REAL-TIME DISTRIBUTED INDUSTRIAL PROCESS SIMULATION SYSTEM

(75) Inventors: Xu Cheng, Pittsburgh, PA (US); Chengtao Wen, Foster City, CA (US)

(73) Assignee: EMERSON PROCESS MANAGEMENT POWER & WATER SOLUTIONS, INC., Pittsburgh, PA (US)

( * ) Notice: Subject to any disclaimer, the term of this patent is extended or adjusted under 35 U.S.C. 154(b) by 370 days.

(21) Appl. No.: 13/365,060

(22) Filed: Feb. 2, 2012

(65) Prior Publication Data
US 2013/0204587 A1 Aug. 8, 2013

(51) Int. Cl.
*G05D 7/06* (2006.01)
*G06N 7/06* (2006.01)
*G05D 16/20* (2006.01)
*G05B 17/02* (2006.01)
*G06F 17/50* (2006.01)

(52) U.S. Cl.
CPC ............ *G05B 17/02* (2013.01); *G05D 16/2073* (2013.01); *G05B 2219/2213* (2013.01); *G05B 2219/2203* (2013.01); *G05D 7/0688* (2013.01); *G05D 16/2006* (2013.01); *G05D 16/20* (2013.01); *G05D 16/2066* (2013.01); *G06F 17/5018* (2013.01); *G06F 17/5036* (2013.01); *G05B 2219/2214* (2013.01)

(58) Field of Classification Search
None
See application file for complete search history.

(56) References Cited

U.S. PATENT DOCUMENTS

| 3,213,014 | A | * | 10/1965 | Atkinson et al. | 208/113 |
| 4,386,403 | A | * | 5/1983 | Hsieh et al. | 716/111 |
| 4,791,593 | A | * | 12/1988 | Hennion | 703/14 |
| 5,469,366 | A | * | 11/1995 | Yang et al. | 716/113 |
| 5,867,397 | A | * | 2/1999 | Koza et al. | 703/14 |
| 5,877,954 | A | * | 3/1999 | Klimasauskas et al. | 700/29 |

(Continued)

FOREIGN PATENT DOCUMENTS

GB 2 475 956 A 6/2011

OTHER PUBLICATIONS

Itou, A., et al., "EJX910 Multivariable Transmitter," Yokogawa Technical Report (English Edition), No. 42 (2006).*

(Continued)

*Primary Examiner* — Kamini S Shah
*Assistant Examiner* — David M Rogers
(74) *Attorney, Agent, or Firm* — Marshall, Gerstein & Borun LLP

(57) ABSTRACT

A pressure and flow calculation technique can be used in a distributed process network simulation system that uses the sequential solving method to perform better or faster simulations of a process flow, especially with respect to process junction nodes at which flow either converges or diverges. The pressure and flow variable determination technique uses a grouped node identification technique that identifies a local set of nodes for each junction node of the process network to use when solving for the pressure at the junction node, a grouped node iteration technique that uses the grouped set of nodes at each junction node to perform iterative pressure calculations at the junction node, and a flow-based pressure calibration technique at each junction node to enable the system to perform highly accurate pressure and flow variable determination at each junction node in real-time.

46 Claims, 14 Drawing Sheets

(56) References Cited

U.S. PATENT DOCUMENTS

| | | | |
|---|---|---|---|
| 5,983,668 A * | 11/1999 | Espie | 62/656 |
| 6,075,932 A * | 6/2000 | Khouja et al. | 716/109 |
| 6,144,932 A * | 11/2000 | Hachiya | 703/14 |
| 6,445,962 B1 * | 9/2002 | Blevins et al. | 700/37 |
| 6,577,992 B1 * | 6/2003 | Tcherniaev et al. | 703/14 |
| 6,748,349 B1 * | 6/2004 | Majumdar et al. | 703/9 |
| 6,907,383 B2 * | 6/2005 | Eryurek et al. | 702/183 |
| 7,277,804 B2 * | 10/2007 | Gebbie et al. | 702/65 |
| 7,970,591 B1 * | 6/2011 | Ratzlaff | 703/2 |
| 8,065,129 B1 * | 11/2011 | Rahmat et al. | 703/14 |
| 8,627,668 B2 * | 1/2014 | Thompson | 60/776 |
| 2004/0153804 A1 * | 8/2004 | Blevins et al. | 714/33 |
| 2006/0277018 A1 * | 12/2006 | Bolcato et al. | 703/14 |
| 2007/0157133 A1 * | 7/2007 | Cheng et al. | 716/4 |
| 2007/0208549 A1 * | 9/2007 | Blevins et al. | 703/6 |
| 2008/0027704 A1 * | 1/2008 | Kephart et al. | 703/22 |
| 2008/0052049 A1 * | 2/2008 | Moriyama et al. | 703/2 |
| 2008/0140379 A1 * | 6/2008 | Shah et al. | 703/14 |
| 2008/0208553 A1 * | 8/2008 | Borah et al. | 703/14 |
| 2009/0018802 A1 * | 1/2009 | de Kleer | 703/2 |
| 2009/0063113 A1 * | 3/2009 | Francino et al. | 703/7 |
| 2010/0023151 A1 * | 1/2010 | Shieh et al. | 700/105 |
| 2010/0223041 A1 * | 9/2010 | Bolcato et al. | 703/2 |
| 2010/0332202 A1 * | 12/2010 | Nakhla et al. | 703/2 |
| 2011/0010138 A1 * | 1/2011 | Cheng et al. | 703/2 |
| 2011/0131017 A1 * | 6/2011 | Cheng et al. | 703/2 |

OTHER PUBLICATIONS

Fay, J.A., "Introduction to Fluid Mechanics," MIT Press, Cambridge, MA, 1994.*

Waheed, A., "Computer Aided Design and Analysis of Closed Loop Piping Systems," Master's Degree Thesis, Graduate College of the Oklahoma State University, Dec. 1992, On the Web: http://www.hvac.okstate.edu/research/Documents/Thesis%20and%20reports/Waheed_CC_92.pdf.*

"HSPICE Elements and Device Models Manual," Version X-2005.09, Synopsys, Inc., Mountain View, CA., Sep. 2005.*

Wu, S., et al., "Model Relaxations for the Fuel Cost Minimization of Steady-State Gas Pipeline Networks," Mathematical and Computer Modelling, vol. 31, 2000, pp. 197-220.*

Rios-Mercado, R., et al., "Efficient Operation of Natural Gas Transmission Systems: A Network-Based Heurestic for Cyclic Structures," Computers and Operations Research, vol. 33, 2006, pp. 2323-2351.*

Search Report for Application No. GB1301914.6, dated Jun. 28, 2013.

* cited by examiner

ENHANCED SEQUENTIAL METHOD FOR SOLVING PRESSURE/FLOW NETWORK PARAMETERS IN A REAL-TIME DISTRIBUTED INDUSTRIAL PROCESS SIMULATION SYSTEM

TECHNICAL FIELD

The present invention relates generally to simulating the operation of power generation plants, industrial manufacturing plants, processing plants and other types of process plants and, more particularly, to a system and method for solving pressure/flow parameters in real-time in a distributed process network simulation system.

DESCRIPTION OF THE RELATED ART

Distributed process control systems, like those typically used in power generation, chemical manufacturing, petroleum processing, industrial manufacturing or other types of plants, typically include one or more controllers communicatively coupled to a plurality of field devices via analog, digital, combined analog/digital, or wireless buses. The field devices, which may be, for example, valves, valve positioners, switches, transmitters (e.g., temperature, pressure, level and flow rate sensors), burners, heat exchangers, furnaces, etc. are located within the plant environment and perform process functions such as opening or closing valves, measuring process parameters, etc. in response to control signals developed and sent by the controllers. Smart field devices, such as the field devices conforming to any of the well-known Fieldbus protocols, may also perform control calculations, alarming functions, and other functions commonly implemented within or by a plant controller. The plant controllers, which are also typically located within the plant environment, receive signals indicative of process measurements made by the field devices and/or other information pertaining to the field devices and execute a control application that executes, for example, different control modules which make process control decisions, generate process control signals based on the received information and coordinate with the control modules or blocks being executed in the field devices, such as HART® and FOUNDATION® Fieldbus field devices. The control modules within the controller send the process control signals over the communication lines or networks to the field devices to thereby control the operation of the process.

Information from the field devices and the controller is usually made available over a data highway to one or more other computer devices, such as operator workstations, personal computers, data historians, report generators, centralized databases, etc., typically placed in control rooms or other locations away from the harsher plant environment. These computer devices may also run applications that may, for example, enable an operator to perform functions with respect to the process, such as changing settings of the process control routine, modifying the operation of the control modules within the controller or the field devices, viewing the current state of the process, viewing alarms generated by field devices and controllers, keeping and updating a configuration database, etc.

As an example, the OVATION® control system, sold by EMERSON PROCESS MANAGEMENT, includes multiple applications stored within and executed by different devices located at diverse places within a process plant. A configuration application, which resides in one or more operator workstations, enables users to create or change process control modules and to download these process control modules via a data highway to dedicated distributed controllers. Typically, these control modules are made up of communicatively interconnected function blocks, which are objects in an object oriented programming protocol and which perform functions within the control scheme based on inputs thereto and provide outputs to other function blocks within the control scheme. The configuration application may also allow a designer to create or change operator interfaces, which are used by a viewing application to display data to an operator and to enable the operator to change settings, such as set-points, within the process control routine. Each of the dedicated controllers and, in some cases, field devices, stores and executes a controller application that runs the control modules assigned and downloaded thereto to implement actual process control functionality. The viewing applications, which may be run on one or more operator workstations, receive data from the controller application via the data highway and display this data to process control system designers, operators, or users using the user interfaces. A data historian application is typically stored in and executed by a data historian device that collects and stores some or all of the data provided across the data highway while a configuration database application may be executed in a still further computer attached to the data highway to store the current process control routine configuration and data associated therewith. Alternatively, the configuration database may be located in the same workstation as the configuration application.

In many industries it is desirable to implement a simulation system for simulating the operation of a plant (including the various plant devices and the control network as connected within the plant). Such a simulation system may be used to test the operation of the plant in response to new or different control variables, such as set-points, to test new control routines, to perform optimization, to perform training activities, etc. As a result, many different types of plant simulation systems have been proposed and used in process plants. None-the-less, only the most complex simulation systems are typically able to perform high fidelity simulation of a process plant because of the complex processes being implemented, the ever changing conditions within the plant including the degradation of devices over time and the presence of unaccounted for disturbance variables within the plant.

When simulating commercial industrial process equipment, it is common and well known to use first principle physical laws or equations to implement a simulation models. In this case, a complex set of first principle equations is developed to model the various plant equipment, and a simulator solves all or most of the model equations simultaneously during any particular simulation cycle. The Newton-Raphson method is a well-known example of a simulation technique that implements simultaneous solving of numerous first principle equations to perform simulation. In fact, this type of equation solving mechanism is, in many cases, perceived as a requirement for high-fidelity simulation. However, a major drawback associated with this simulation approach is that the physical models are complex and computationally expensive, especially when the system to be modeled is highly nonlinear and interactive. As a result, these simulation systems must use a centralized nonlinear equation solver to perform the simulation so as to be able to solve all of the coupled nonlinear equations simultaneously. Unfortunately, this technique is usually slow, is computationally inefficient, and is numerically unreliable.

Distributed simulation of large scale, dynamic process networks has been implemented in an attempt to overcome some of the problems associated with centralized simulation techniques. In distributed simulation systems, various simulation tasks are performed throughout a number of different devices (e.g., processors) and these simulation tasks are implemented (executed) separately or independently of one another. Such distributed simulation systems provide a number of advantages over centralized simulation systems, including space decoupling, time decoupling, integrator decoupling and the ability to use parallel processing. In particular, distributed simulation systems provide space decoupling by breaking down a large simulation problem into a set of smaller sub-problems, thereby allowing one simulation module to be changed, updated or added without affecting the other simulation modules. Distributed simulation systems also provide time decoupling by allowing the use of different integration step sizes for different dynamic modules, which means that these systems can provide better numerical robustness and higher computation efficiency for hard to solve simulation problems without needing to implement an overly aggressive integration step size in each of the simulation modules. Distributed simulation systems provide integrator decoupling as the separate simulation modules can use specific and tailor made integration methods that are different from one another in different modules, thereby enabling different mathematical techniques to be used to solve the different process models. Distributed simulation systems also enable the use of parallel processing, as the different simulation modules can be implemented simultaneously on a distributed network of computers. This feature also allows for easy trouble shooting, as problems can usually be identified locally with respect to a particular simulation module.

However, efficient solving of the pressure-flow variables at each node or component of a distributed simulated network is an important part of real-time process simulation, as without it, the simulation will not be very accurate or useful. In particular, in process flow network simulations, fluid pressure and fluid flow at or through each of the simulated process components need to be calculated during each discrete sampling time interval while observing the mass conservation law at any given moment. Because all of the components being simulated are connected together in a network, the time required to complete the entire calculation can be challenging, especially when the network size is large. There are two popular methods that are typically used to solve for the pressure and flow variables in a real-time simulated pressure-flow network. The first method can be referred to as a simultaneous solving method while the second method can be referred to as a sequential solving method.

In the simultaneous solving method, a nonlinear equation solver is utilized to solve all of the pressure and flow equations together or simultaneously within one discrete sampling time interval. While a Newton-type of solver is typically employed in these types of simulation systems, other types of solvers can be used as well. By solving the pressure and flow relationships in the network in this manner, flow mismatch between the different components can be avoided. Distributed simulation techniques that implement the simultaneous solving method typically use a master-slave (client-server) structure in which a central coordinator (server) knows the overall flow diagram or flow sheets of the network and this server computer coordinates the flow of interconnection variables between different modules, while client computers execute or perform the integration of each sub-system.

There are many disadvantages of using this distributed simulation approach. For example, the algorithms in these types of distributed systems may not efficiently deal with the case in which the number of sub-systems is large because, in such a situation, there is a heavy computational load on the server side. In particular, the central coordinator must calculate and break the mass and energy balances at the transient stages, which places a high computational load on the central server, especially in a large system. Of course, if the server has too heavy of a computational load, the simulation system slows down, which may make the simulation system impractical for use as a real-time simulator, i.e., one that is able to perform simulation calculations to model the operation of a process network in real time. This disadvantage is especially prevalent when the size of the network being simulated is large, as the computational time needed for a simultaneous system grows exponentially as the number of calculated pressure nodes increases. Another potential problem is that the available communication bandwidth may be insufficient. In particular, at the synchronization point (i.e., at the central server), the communication load of the network may be huge, requiring a high hardware implementation cost. The other shortcoming of this approach is that the entire structure is pre-built, which means that the solver may have difficulty in handling matrix singularities that can arise in certain situations. For example, when two valves in a single straight flow path are both closed, the solver may not be able to directly determine the pressures in between these nodes, if the equations are not processed properly. This problem can lead to a failure of the simulation system as a whole in certain process situations.

The second simulation approach, i.e., the sequential solving method, solves the pressure and flow at each network component individually in a sequential manner. The order of module execution is not a key factor and, more importantly, complete flow balance (or equivalence) is not required during each sampling time. For this reason, the computational load for the sequential solving approach is much less than the simultaneous solving approach. Because of this fact, the sequential solving approach is typically more suitable for implementation in a real-time simulation system. However, in the sequential solving type of system, a mechanism has to be provided to reconcile flow differences between various ones of the network components if convergence is not reached at the end of the numerical iteration, i.e., when the computation time expires. Moreover, due to the nature of this approach, the determination of the pressure and flow propagation through the network can be slow for a large-sized network. If not handled properly, this slow propagation can degrade the degree of simulation fidelity.

An example of this second simulation approach, which does not need a central coordinator, is described in U.S. Patent Application Publication No. 2011/0131017, (U.S. patent application Ser. No. 12/628,821), the entire disclosure of which is hereby expressly incorporated by reference herein. In this system, a high fidelity distributed plant simulation technique performs real-time simulation or prediction of a process or plant network using a distributed set of simulation modules without requiring a centralized coordinator to coordinate the operation of the system. The distributed simulation system described in this publication, which accurately solves mass and flow balances at the distributed sites in both steady state and dynamic conditions, includes any number of separate simulation modules, each of which implements first principle models or other types of models to model the operation of a plant component. This distributed simulation system includes plant element simulation modules that model various plant components, such as tanks, heat exchangers, etc. and may include pipe simulation modules that model connection elements within the process or plant, such as pipes, etc., which operate to transport material flow from one plant element to another plant element. Each of the simulation modules implements mass flow, pressure and/or temperature balancing equations which take into account the pressures, flow rates, and/or temperatures of upstream or downstream simulation modules, to thereby balance mass flows without the need of a central coordinator. Each simulation module also communicates with both upstream and downstream simulation modules and implements model equations that assure that mass flow is conserved across or between the upstream and downstream components. These simulation modules thereby eliminate the need for a central coordinator that tracks flow or that implements mass balancing equations for all of the distributed simulation modules. Still further, in the process of implementing mass flow balancing equations, the simulation modules provide feedback from downstream process element simulation modules to upstream process element simulation modules, so that changes in the downstream elements, such as changes in settings of flow shut-off valves, can be recognized and modeled in upstream elements, without the use of global variables within the simulation system and, again, without the use of a central coordinator.

Additionally, this simulation system implements a procedure that recognizes temporary mass imbalances in simulation modules, caused by, for example, transient or dynamic conditions, and deals with these transient mass imbalances in a manner that conserves mass over time and across multiple simulation modules, so as to provide an accurate simulation of the plant in the presence of dynamic changes, again without the need of a central coordinator. Here, each simulation module associated with a non-mass storage device (e.g., a pipe) recognizes a disparity of mass flow between its input and its output as a result of a dynamic or a transient flow situation (i.e., a situation in which mass flow is increasing or decreasing), and communicates the amount of this mass imbalance to an upstream or a downstream simulation module. Over numerous cycles of the simulation system, mass imbalances detected by simulation modules associated with non-mass storage devices are thereby transferred to and are accumulated in simulation modules associated with mass storage devices (e.g., tanks), where the mass actually accumulates or depreciates. The simulation modules associated with the mass storage devices can accept and balance these transient masses over long term operation of the simulation system. This feature assures that mass is neither gained nor lost as a result of the modeling of mass flow through non-mass storage devices during dynamic changes in mass flow through these elements.

As will be understood, there is a need in this distributed simulation system to perform high fidelity pressure and flow variable calculations at each of the nodes of a distributed simulation system. These types of calculations can become complicated, however, when the flow paths of the network converge or diverge at a particular node. In fact, if not performed correctly, the pressure and flow calculations performed for nodes that have converging or diverging flows in a distributed simulation network can quickly become inaccurate, leading to a sub-par simulation. This fact is especially true when the flow network is undergoing transient flows or experiencing other than steady-state flow conditions.

SUMMARY

A pressure and flow calculation technique can be used in a distributed or other process network simulation system that uses the sequential solving method to perform better or faster simulations of a process flow, especially with respect to process junction nodes at which flow either converges or diverges. The new pressure and flow variable determination technique uses a grouped node identification technique that identifies a local set of nodes for each junction node of the process network to use when solving for the pressure at the junction node, a grouped node iteration technique that uses the grouped set of nodes at each junction node to perform pressure calculations for the junction node, and a flow-based pressure calibration technique at each junction node to enable the system to perform highly accurate pressure and flow variable determination at each junction node in real-time.

In one case, a high fidelity distributed plant simulation technique performs real-time simulation or prediction of a process or plant network in a manner that uses a distributed set of simulation modules without requiring a centralized coordinator to coordinate the operation of the system, and in a manner that accurately solves mass and flow balances at the distributed sites in both steady state and dynamic conditions. In particular, the simulation system described herein may include any number of separate simulation modules, each of which implements first principle models or other types of models to model the operation of a plant component. The simulation system may include plant element simulation modules that model various plant components, such as tanks, heat exchangers, etc., and may include pipe simulation modules that model connection elements within the process or plant, such as pipes, etc., which operate to transport material flow from one plant element to another plant element.

Pressures and flows at each junction node of the process network (e.g., each node at which flow converges and/or diverges) may be determined by first forming a simplified process network diagram having a set of junction nodes and starting and stopping nodes separated by composite process elements having a single flow stream traveling therethrough. Thereafter, a set or group of nodes may be determined for each of the junction nodes of the simplified process network as a selected set of junction nodes including a base junction node and junction nodes close to or adjacent to the base junction node and as a set of boundary nodes including any node adjacent one or more of the set of selected junction nodes. As referred to herein, a "base junction node" or a "base node" is the process node for which or at which the simulation system is determining or using a grouped set of nodes to calculate process variables, such as a pressure and a flow. Such a grouping of nodes may be determined for each junction node at which pressure needs to be determined within the simulation system. Thereafter, the pressure at each of the junction nodes may be determined during any simulation cycle using an iterative technique that relies on the grouped set of nodes determined for each junction node to calculate the pressure at the junction node being analyzed. This iterative technique may determine a new value of the pressure at each of the junction nodes within the grouped set of nodes that results in flow balance through the junction nodes, assuming that the pressures at the boundary nodes are known and relatively fixed. In this manner, the pressures at each of the junction nodes of the process network may be determined individually using local nodal calculations that perform calculations of pressures at a limited set of adjacent junction nodes.

Thereafter, the flows into and out of the junction nodes based on the determined pressures may be checked for flow balance (e.g., conservation of mass). If flow balance is not achieved at the end of a simulation cycle for a particular junction node, a flow-based pressure calibration technique may be used to indirectly modify the nodal pressure of the particular junction node to correct for this flow imbalance, by determining a compensated flow conductance for an input flow into the particular junction node. This compensated flow conductance value may be used in the iterative process of the next sampling cycle to speed up the iteration to a steady-state pressure calculation at the particular junction node (i.e., one that results in balanced flow into and out of the particular junction node).

In this manner, pressure and flow calculations are performed for each of the junction nodes of the process network (i.e., nodes at which flows converge or diverge) to determine a subset of the entire set of pressures in the process network first in a manner that meets or preserves flow balance at the junction nodes. Thereafter, the pressures at the junction nodes, as determined during a particular simulation time sampling interval or simulation cycle, are used to determine the flows and pressures at individual nodes (non-junction nodes) along each flow path of the network in a straightforward manner.

Using this technique, a set of simulation modules is able to implement mass flow, pressure and/or temperature balancing equations that take into account the pressures, flow rates, and/or temperatures, etc., of upstream or downstream simulation modules, to thereby balance mass flows without the need of a central coordinator, but in a manner that is highly computationally efficient. In particular, each simulation module communicates with both upstream and downstream simulation modules and implements model equations that assure that mass flow is conserved across or between the upstream and downstream components. These simulation modules thereby eliminate the need for a central coordinator that tracks flow or that implements mass balancing equations for all of the distributed simulation modules. Still further, in the process of implementing mass flow balancing equations, the simulation modules provide feedback from downstream process element simulation modules to upstream process element simulation modules, so that changes in the downstream elements, such as changes in settings of flow shut-off valves, can be recognized and modeled in upstream elements, without the use of global variables within the simulation system and, again, without the use of a central coordinator. This feature avoids matrix singularities that can occur in a centralized simulation technique.

Still further, the simulation system implements a procedure that recognizes temporary mass imbalances in simulation modules, caused by, for example, transient or dynamic conditions, and deals with these transient mass imbalances in a manner that conserves mass over time and across multiple simulation modules, so as to provide an accurate simulation of the plant in the presence of dynamic changes, again without the need of a central coordinator. In particular, each simulation module associated with a non-mass storage device (e.g., a pipe) recognizes a disparity of mass flow between its input and its output as a result of a dynamic or a transient flow situation (i.e., a situation in which mass flow is increasing or decreasing), and communicates the amount of this mass imbalance to an upstream or a downstream simulation module. Over numerous cycles of the simulation system, mass imbalances detected by simulation modules associated with non-mass storage devices are thereby transferred to and are accumulated in simulation modules associated with mass storage devices (e.g., tanks), where the mass actually accumulates or depreciates. The simulation modules associated with the mass storage devices can accept and balance these transient masses over long term operation of the simulation system. This feature assures that mass is neither gained nor lost as a result of the modeling of mass flow through non-mass storage devices during dynamic changes in mass flow through these elements.

BRIEF DESCRIPTION OF THE DRAWINGS

11B determined by a node grouping technique when the second junction node is selected as a base junction node.

DETAILED DESCRIPTION

Figure 1:
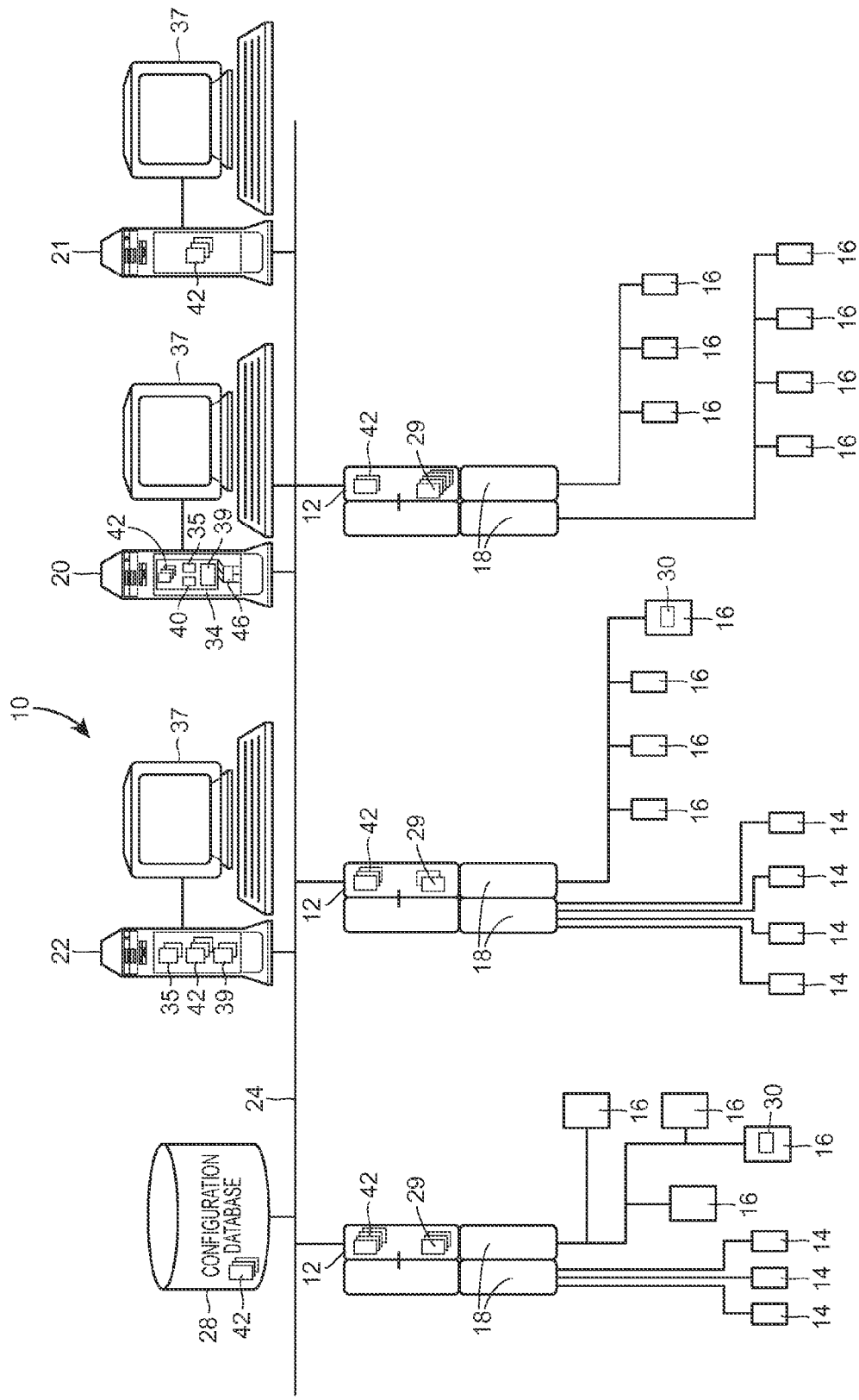
FIG. 1 is a block diagram of a distributed plant and process control network located within a plant such as a power plant, including one or more operator workstations, controllers, or virtual controllers that implement a simulation system including a set of distributed simulation modules configured to accurately simulate the operation of the plant.

Referring now to FIG. 1, an example distributed control network for a plant 10, such as that associated with a power generation plant, an industrial manufacturing plant, a processing plant, etc. is illustrated at an abstract level of detail. The plant 10 includes a distributed control system having one or more controllers 12, each of which is connected to one or more field devices 14 and 16 via input/output (I/O) devices or cards 18 which may be, for example, Fieldbus interfaces, PROFIBUS® interfaces, HART® interfaces, standard 4-20 ma interfaces, etc. The controllers 12 are also coupled to one or more host or operator workstations 20, 21 and 22 via a data highway 24 which may be, for example, an Ethernet link. A database 28 may be connected to the data highway 24 and operates as a data historian to collect and store parameter, status and other data associated with the controllers 12 and field devices 14, 16 within the plant 10. Additionally or alternatively, the database 28 may operate as a configuration database that stores the current configuration of the process control system within the plant 10 as downloaded to and stored within the controllers 12 and field devices 14 and 16. While the controllers 12, the I/O cards 18 and the field devices 14 and 16 are typically located down within and are distributed throughout the sometimes harsh plant environment, the operator workstations 20, 21 and 22 and the database 28 are usually located in control rooms or other less harsh environments easily assessable by controller or maintenance personnel.

As is known, each of the controllers 12, which may be by way of example, the OVATION® controller sold by EMERSON PROCESS MANAGEMENT POWER AND WATER SOLUTIONS, INC., stores and executes a controller application that implements a control strategy using any number of different, independently executed, control modules or blocks 29. Each of the control modules 29 can be made up of what are commonly referred to as function blocks wherein each function block is a part or a subroutine of an overall control routine and operates in conjunction with other function blocks (via communications called links) to implement process control loops wi0thin the process plant 10. As is well known, function blocks, which may but need not be objects in an object oriented programming protocol, typically perform one of an input function, such as that associated with a transmitter, a sensor or other process parameter measurement device, a control function, such as that associated with a control routine that performs proportional-integral-derivative (PID), fuzzy logic, etc. control, or an output function that controls the operation of some device, such as a valve, to perform some physical function within the process plant 10. Of course hybrid and other types of complex function blocks exist such as model predictive controllers (MPCs), optimizers, etc.

In the plant 10 illustrated in FIG. 1, the field devices 14 and 16 connected to the controllers 12 may be standard 4-20 ma devices, may be smart field devices, such as HART®, PROFIBUS®, or FOUNDATION® Fieldbus field devices, which include a processor and a memory, or may be any other desired type of field devices. Some of these devices, such as Fieldbus field devices (labeled with reference number 16 in FIG. 1), may store and execute modules, or sub-modules, such as function blocks, associated with the control strategy implemented in the controllers 12. Function blocks 30, which are illustrated in FIG. 1 as being disposed in two different ones of the Fieldbus field devices 16, may be executed in conjunction with the execution of the control modules 29 within the controllers 12 to implement one or more process control loops, as is well known. Of course, the field devices 14 and 16 may be any types of devices, such as sensors, valves, transmitters, positioners, etc., and the I/O devices 18 may be any types of I/O devices conforming to any desired communication or controller protocol such as HART®, Fieldbus, PROFIBUS®, etc.

Still further, in a known manner, one or more of the workstations 20-22 may include user interface applications to enable a user, such as an operator, a configuration engineer, a maintenance person, etc., to interface with the process control network within the plant 10. In particular, the workstation 22 is illustrated as including a memory 34 which stores one or more user interface applications 35 which may be executed on a processor 46 within the workstation 22 to communicate with the database 28, the control modules 29 or other routines within the controllers 12 or I/O devices 18, with the field devices 14 and 16 and the modules 30 within these field devices, etc., to obtain information from the plant, such as information related to the ongoing state of the plant equipment or the control system. The user interface applications 35 may process and/or display this collected information on a display device 37 associated with one or more of the workstations 20-22. The collected, processed and/or displayed information may be, for example, process state information, alarms and alerts generated within plant, maintenance data, etc. Likewise, one or more applications 39 may be stored in and executed in the workstations 20-22 to perform configuration activities such as creating or configuring the modules 29 and 30 to be executed within the plant, to perform control operator activities, such as changing set-points or other control variables, within the plant, etc. Of course the number and type of routines 35 and 39 are not limited by the description provided herein and other numbers and types of process control related routines may be stored in and implemented within the workstations 20-22 if desired.

The workstations 20-21, the database 28 and some of the controllers 12 of FIG. 1 are also illustrated as including components of a distributed simulation system that may be implemented in a distributed computer network, such as that of FIG. 1. In particular, the workstation 20 is illustrated as including a set of simulation support applications 40, which may include a simulation configuration application, a user interface application and data structures for performing simulation of the process plant 10 in a manner described herein. Generally speaking, the simulation applications 40 enable a user to create, implement and view the results of a distributed simulation system within the computer network system of FIG. 1. More particularly, the distributed simulation system includes various distributed simulation modules 42 that may be located in various different computing devices (also referred to as drops) on the computer network of FIG. 1. In particular, a "drop" is a computing device or a virtual computing device that calculates or executes one or more of the simulation or control algorithm/modules. Each of the simulation modules 42 stores a model that is implemented to simulate the operation of an individual plant component or group of components, and the simulation modules 42 communicate directly with one another to implement a simulation of a larger portion of the plant 10. Any particular simulation module 42 may be used to simulate any portion or part of the plant 10, including a particular piece of plant equipment involved in processing or material flow, such as a tank, a heat exchanger, a controller, etc., or a group of equipment, such as a unit. Still further, the simulation modules 42 may be located in and executed in various different devices or drops on the computer network and may communicate via, for example, the communication bus 24 to send data between the simulation modules 42 so as to perform simulation of a larger group or set of plant equipment. Of course, any desired number of simulation modules 42 may be located in any particular drop and each drop will execute the simulation modules 42 therein independently of the other drops, so as to implement distributed simulation. However, if desired, all of the simulation modules 42 associated with any particular simulation may be stored in an executed by the same computer device (i.e., at a single drop) and still be implemented in the manner described herein.

The simulation applications 40 may be accessed by any authorized user (such as a configuration engineer, an operator or some other type of user) and may be used to create and configure a particular instance of a distributed simulation system, by creating a set of simulation modules 42 and downloading these modules 42 to different drops within the plant or computer network. As illustrated in FIG. 1, various ones of the distributed simulation modules 42 may be downloaded to and implemented in the workstations 20-22, the controllers 12, the database 28 and/or any other computer device or processing device connected to the communication network 24. If desired, simulation modules 42 may be located and implemented in other processing devices that are indirectly connected to the network 24, such as in the field devices 16, in a business local area network (LAN) or even a wide area network (WAN) connected to one of the devices on the network 24. Still further, while the bus 24 is illustrated in FIG. 1 as the main communication network used to connect various drops that implement simulation modules, other types of communication networks could be used to connect drops, including any desired LANs, WANs, the internet, wireless networks, etc.

Once downloaded, the simulation modules 42 execute individually but operate in conjunction with one another to perform simulation of the plant or components and equipment within the plant, as being controlled by the control blocks 29 and 30 as well as other controller routines executed within the controllers 12 and possibly the field devices 14, 16. Such a distributed simulation system may enable a user to perform different simulation and prediction activities with respect to the plant 10, via a user interface application in the suite of simulation applications 40. If desired, a distributed simulation system may simulate an operating plant or any portion thereof, such as that illustrated in FIG. 1, or may simulate a plant that is not operating on-line or even a plant that has not actually been constructed.

While prior art distributed simulation systems have included simulation components executed in separate computing devices with the simulation components using first principle algorithms, these prior art simulation systems had difficulty in providing coordination between the separate simulation components because of the need to balance mass flows and to equalize or match pressures, temperatures, etc. between the separate components. This was especially problematic in prior art simulation systems in which downstream components affected the mass flow rates and pressures of upstream components. For example, the shutting or closing of a valve downstream of a set of plant components affects the upstream mass flows and pressures, and a simulation system must account for these changes. In the past, distributed simulation systems (such as process control simulation systems) typically did not enable downstream changes to be recognized in the modeling of upstream components, at least at the distributed module, because module calculations were performed at the upstream components first, and the results thereof were propagated to the downstream components for use in the modeling of the downstream components. Because information flow was typically from an upstream component to a downstream component, changes made to the settings of the downstream components could not be accounted for in the upstream components models. To solve this problem when simulating mass flow, a central coordinator was typically used to manage downstream changes and to account for these changes, as well as to perform mass flow and pressure balancing between the various distributed simulation elements.

The distributed simulation system described herein, on the other hand, implements a distributed simulation technique that solves the process models individually or in some situations in groups, such that all major equipment/component models can be based on first-principle equations, if desired, while accounting for downstream changes and while solving for mass and momentum balances at the distributed simulation modules themselves. Moreover, in this distributed simulation system, the model equations may be solved sequentially without requiring strict execution order and without requiring the use of a central coordinator, which effectively simplifies the solving and trouble-shooting process while also allowing more flexibility for future modification and expansion because the system architecture is distributed in nature.

As noted above, one of the difficulties that arises from a distributed simulation approach is the need to synchronize interacting information among different equipment component simulation modules. In particular, because the model equations are solved separately based on individual component characteristics, there is no guarantee that the computational result of one model calculation will match the conditions resulting from the computations performed in another module. A simple example of this problem can be illustrated in the case of the modeling of two cascade steam/flue-gas heat exchangers (typically used in an industrial boiler system), in which the steam flow outlet of the first heat exchanger is connected to the inlet of the second heat exchanger through a pipe (or piping system). In any state of the system, the inlet/outlet connections of the two heat exchangers must have matching steam flow rates (neglecting piping dynamics), because there is no other way for steam enter or exit the system. However, if the first-principle model equations are solved for each heat exchanger individually, the resulting mass flow rates for the two heat exchangers may not be consistent.

Another difficulty in implementing this sequential solving mechanism relates to the directionality of the component execution order. In a typical drag-and-drop type of graphically built control scheme, each individual component is solved sequentially in one direction. One component sends its calculation output to the inputs of the next connected component. However, the upstream component does not take into consideration the calculation result (even any intermediate result) from the downstream component. In other words, if there is no explicit feedback from downstream component to the upstream component, any process change in the downstream component will not be reflected in the upstream component unless a large amount of global variables are defined. However, it is typically undesirable to use global variables in a process control system or a plant control system, especially in a distributed control system, because such global variables constrain and may cause problems with the operation of the distributed components, which are typically constructed to be able to assign and use any local variables without worrying about interfering with other components in the system.

In order to make this approach as close as possible to high-fidelity in a graphically built commercial simulation environment, three strategies may be implemented and enforced in the distributed simulation system described herein. First, a piping mechanism is enforced to reconcile flow rates in all connecting paths. Second, all values utilized by the system at runtime are housed in a data structure termed a record, which is a collection of related values. The system identifies all records using a unique numerical identifier termed a system ID. Every simulation algorithm block is assigned a record that houses all configuration information about the model for that simulation block. Moreover, once the system ID of a model algorithm is known, not only is the configuration information stored in its record accessible, all dynamic information computed during runtime by the simulation module or its associated modeling algorithm is also available. These algorithm record system IDs can be utilized to facilitate a type of inter-process communication between algorithms or simulation blocks. In one case, the system ID of a simulation algorithm may be assigned a signal pin in the graphical control builder environment, which allows the user to connect the signals together to define information paths. Using this methodology, the user can define a flow stream (e.g., flow of water, steam, or any other kind of medium) between two simulation modules or algorithm blocks by simply connecting the algorithm record signals together.

Third, in a discrete-time computer implementation, a fast sampling rate is used to minimize component-to-component propagation delay, especially when the propagation direction is not the same as the sequential execution order. Taking advantage of the distributed nature of a distributed control system platform is almost guaranteed to satisfy this requirement. In theory, any desired model enhancement, expansion or addition to the simulation system may be accommodated by adding another processing unit to the networked system.

While the distributed simulation system described herein can be used in any desired type of plant to simulate material flow through the plant (liquids, gases or even solids), one example distributed simulation system is described herein as being used to simulate a power generation plant being controlled using distributed control techniques. However, the distributed simulation technique described herein can be used in other types of plants and control systems, including industrial manufacturing and processing plants, water and waste water treatment plants, etc., and can be used with control systems implemented centrally or as distributed control systems.

Figure 2:
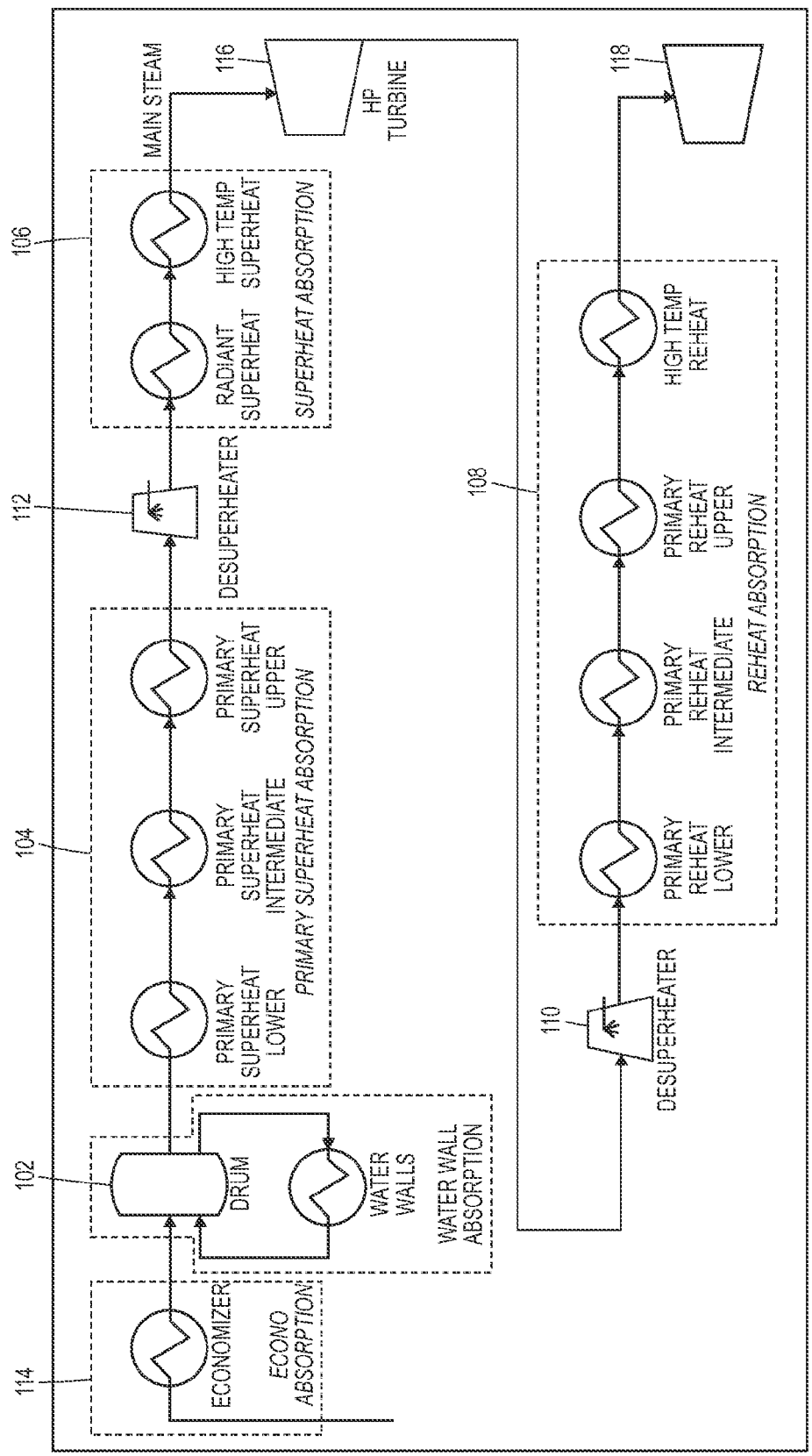
FIG. 2 is a block diagram of various components of a boiler steam cycle of a typical boiler based power plant that may be simulated using the distributed simulation system of FIG. 1.

FIG. 2 illustrates a block diagram of a boiler steam cycle for a typical boiler 100 that may be used, for example, by a thermal power generation plant. The boiler 100 includes various sections through which steam or water flows in various forms such as superheated steam, reheat steam, etc. While the boiler 100 illustrated in FIG. 2 has various boiler sections situated horizontally, in an actual implementation, one or more of these sections may be positioned vertically, especially because flue gases heating the steam in various boiler sections, such as a water wall absorption section, rise vertically.

In any event, the boiler 100 illustrated in FIG. 2 includes a water wall absorption section 102, a primary superheat absorption section 104, a superheat absorption section 106 and a reheat section 108. Additionally, the boiler 100 includes one or more de-superheaters 110 and 112 and an economizer section 114. The main steam generated by the boiler 100 is used to drive a high pressure (HP) turbine 116 and the hot reheat steam coming from the reheat section 108 is used to drive an intermediate pressure (IP) turbine 118. Typically, the boiler 100 may also be used to drive a low pressure (LP) turbine, which is not shown in FIG. 2.

The water wall absorption section 102, which is primarily responsible for generating steam, includes a number of pipes through which steam enters a drum. The feed water coming into the water wall absorption section 102 may be pumped through the economizer section 114. The feed water absorbs a large amount of heat when in the water wall absorption section 102. The water wall absorption section 102 has a steam drum, which contains both water and steam, and the water level in the drum has to be carefully controlled. The steam collected at the top of the steam drum is fed to the primary superheat absorption section 104, and then to the superheat absorption section 106, which together raise the steam temperature to very high levels. The main steam output from the superheat absorption section 106 drives the high pressure turbine 116 to generate electricity.

Once the main steam drives the HP turbine 116, the exhaust steam is routed to the reheat absorption section 108, and the hot reheat steam output from the reheat absorption section 108 is used to drive the IP turbine 118. The de-superheaters 110 and 112 may be used to control the final steam temperature to be at desired set-points. Finally, the steam from the IP turbine 118 may be fed through an LP turbine (not shown here) to a steam condenser (not shown here), where the steam is condensed to a liquid form, and the cycle begins again with various boiler feed pumps pumping the feed water for the next cycle. The economizer section 114 is located in the flow of hot exhaust gases exiting from the boiler and uses the hot gases to transfer additional heat to the feed water before the feed water enters the water wall absorption section 102.

Figure 3:
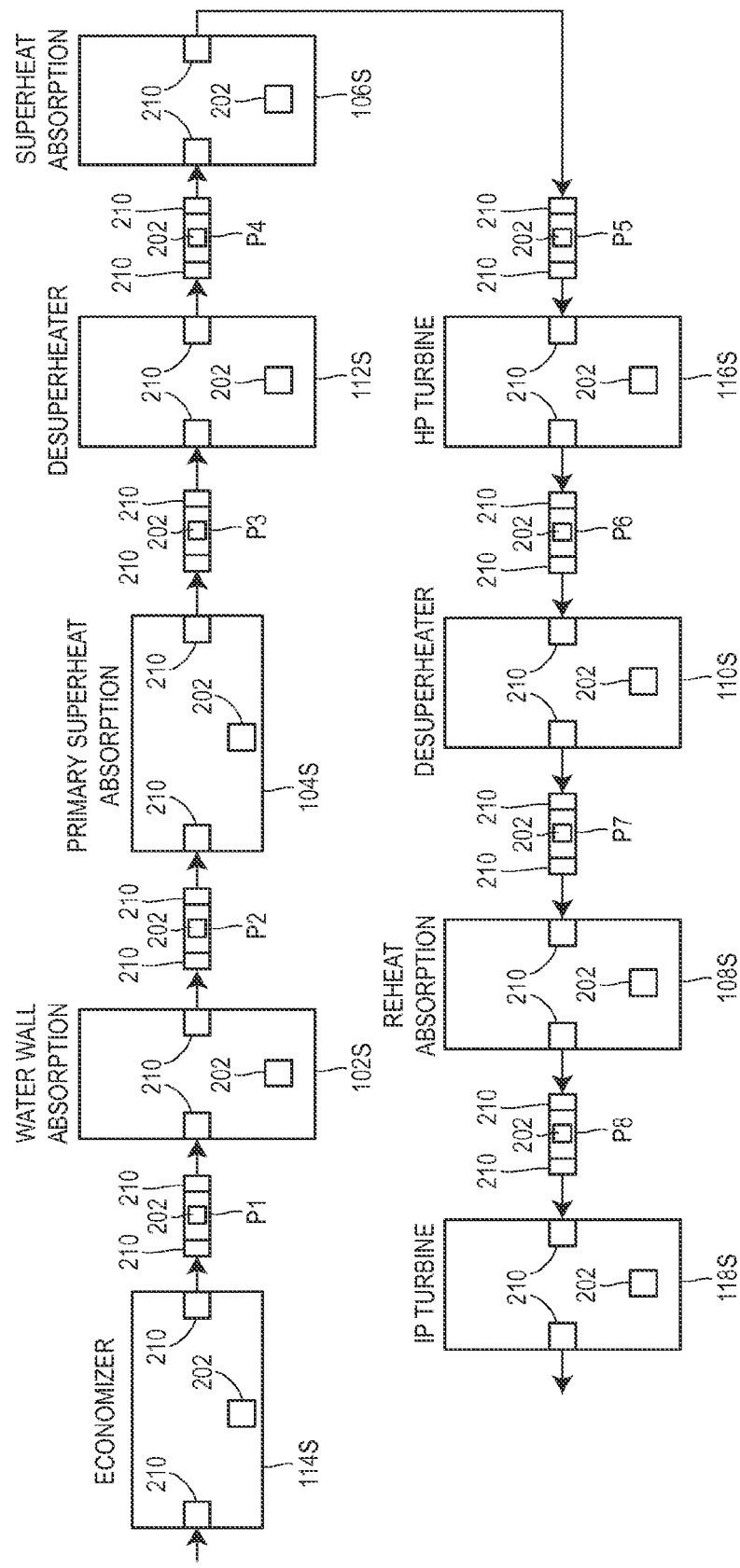
FIG. 3 is a block diagram of a set of distributed simulation modules of a distributed simulation system configured to simulate the operation of the boiler steam cycle of the power plant of FIG. 3.

FIG. 3 illustrates a set of simulation modules 42 that may be used or implemented in a distributed manner to simulate the operation of the boiler steam cycle of FIG. 2. As can be seen in FIG. 3, the distributed simulation modules 42 include separate simulation modules for each of the main plant elements depicted in FIG. 2 including a water wall absorption simulation module 102S, a primary superheat absorption simulation module 104S, a superheat absorption simulation module 106S, a reheat absorption simulation module 108S, desuperheater simulation modules 110S and 112S, an economizer simulation module 114S, and turbine simulation modules 116S and 118S. Of course, these simulation modules include plant element models, which may be in the form of first-principle equations, or any other desired types of models, which model the operation of these elements to produce simulated outputs for the corresponding plant equipment of FIG. 2 based on the inputs provided thereto. While a separate simulation module is illustrated in FIG. 3 for each of the major plant components of FIG. 2, simulation modules could be made for sub-components of these the components of FIG. 2 or a single simulation module could be created combining multiple ones of the plant components of FIG. 2.

However, as illustrated in FIG. 3, the distributed simulation system also includes pipe simulation modules P1-P8 which are disposed between the plant element simulation modules described above. The general operation of the pipe simulation modules P1-P8 will be described in more detail below, but are primarily responsible for modeling flow between plant element simulation modules, providing feedback from downstream simulation modules to upstream simulation modules and implementing mass flow and momentum balancing equations to equalize the simulations performed by the different plant element simulation modules. Thus, generally speaking, the distributed simulation technique and system described herein uses a number of separate simulation modules, wherein each simulation module models or represents a different active component in the process or plant being simulated (referred to herein as plant element simulation modules) or models or represents a connection element within the plant (referred to herein as pipe simulation modules). During operation, each simulation module may be executed separately, either in a common machine or processor or in separate machines or processors, to thereby enable parallel and distributed processing. Thus, for example, the different simulation modules of FIG. 3 can be executed in different and various ones of the workstations 20-22 of FIG. 1, the controllers 12 of FIG. 1, the field devices 16 of FIG. 1, the database 28 of FIG. 1, etc.

As indicated above, and as illustrated in FIG. 3, each of the simulation modules of FIG. 3 includes one or more executable models 202 for modeling the operation of an associated plant element or pipe and the simulation modules operate to implement these model(s) 202 to simulate operation of a plant element based on the inputs delivered to the plant element (in the form of fluids, solids, control signals, etc.) In most cases, the simulation modules will perform simulation based on an indication of an input (e.g., a fluid input, a gas input, etc.) from an upstream simulation module and will produce one or more output indications, indicating an output of the process or plant element (e.g., in the form of a fluid or gas output, etc.) The models 202 used in the plant element simulation modules may be first principle models or any other suitable type of models for the particular piece of equipment being simulated. The pipe simulation modules P1-P8 of FIG. 3 also include models 202 or a set of equations that implement mass flow and momentum balancing routines to balance the mass flow, pressures, etc., between the different process simulation elements. One particular example of storing and implementing flow and pressure equations will be described in more detail below with respect to FIGS. 9 and 10A-10D.

Importantly, one or more of the models 202 of FIG. 3 is designed and configured to model operation of a plant element using one or more process variables (e.g., pressure, temperature, flow rate, etc.) associated with an upstream and/or a downstream simulation module and operate to balance pressures, flow rates, temperatures, etc., between the simulation modules so as to assure conservation of mass, etc. across the multiple simulation modules. Moreover, a model for a particular simulation module uses downstream information (i.e., pressures, flow rates, temperatures, etc., from downstream simulation modules) in performing simulation of its associated plant element (in addition to upstream elements). Because information flows from downstream elements to upstream elements automatically, this information is then taken into account during the successive simulation cycles leading to a more accurate overall simulation. Moreover, in some cases, information may flow between adjacent simulation elements multiple times during a particular simulation cycle or execution period.

Thus, as indicated above, there are two basic types of simulation modules, including process element simulation modules and pipe simulation modules. As used herein process element simulation modules simulate plant elements that perform mass flow addition or reduction or that perform mechanical energy addition or reduction other than at the inlet and the outlet thereof, although other plant elements may be modeled by process element simulation modules. Examples of process simulation elements include heat exchangers, boilers, superheaters, tanks, etc. The concept of a pipe simulation module, as used herein, includes all types of connecting devices that do not have mass flow addition or reduction or any mechanical or thermal energy addition or reduction other than at the inlet and outlet thereof. Pipe simulation modules may include, but are not limited to, simulations of actual pipes (long or short), valves, junctions/splitters, etc. Basically, pipe simulation modules are used to introduce an opportunity in the simulation technique to implement mass flow balancing operations between the distributed simulation modules. In the process of implementing these balancing equations, the pipe simulation modules also provide feedback from downstream simulation modules to upstream simulation modules to enable events or variables that are changed in downstream components to be reflected in and affect upstream simulation modules in a relatively quick manner, without the use or need of a central coordinator.

In order to operate properly without the need of a centralized coordinator, each of the simulation modules of FIG. 3 receives information directly from its immediately connected upstream and downstream simulation modules, with this information being indicative of certain process and control variable information associated with or calculated in these upstream and downstream simulation modules. To implement this communication structure, each of the simulation modules of FIG. 3 includes one or more memory storage locations 210 that are uniquely associated or tied to the simulation module and which store information from an upstream and/or a downstream simulation module to be used by the simulation module during its modeling procedure. The details of this memory and communication structure will be described in more detail below.

In any event, each of the simulation modules of FIG. 3, including the pipe simulation modules P1-P8 may perform mass flow balancing between the inputs and output of two or more associated simulation modules, in a manner that enables small computational inaccuracies to be corrected for or accounted for in the entire simulation, and in a manner that enables changes in a downstream plant element simulation module to be used or reflected in an upstream plant element simulation module. In general, each simulation model 202 uses process variables, such as pressure, temperature, flow rate, etc., of both the immediate upstream simulation component(s) and the immediate downstream simulation component(s), to balance the mass flow and other variables between the outputs of these upstream and downstream components to thereby assure a simulation result that is balanced (e.g., conserves mass flow) across multiple simulation components.

Figure 4:
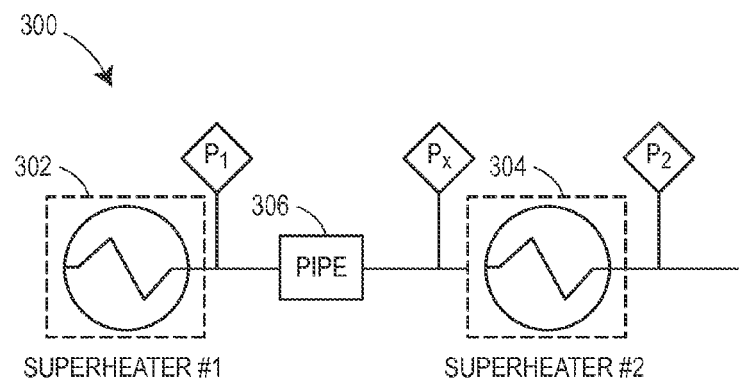
FIG. 4 illustrates a pipe simulation module communicatively connected between two plant element simulation modules in the form of heat exchanger simulation modules to perform mass flow balancing between the two plant element simulation modules.

A section of the simplified simulation system 300 illustrated in FIG. 4 will be used to illustrate the operation of a pipe simulation module in conjunction with an upstream and a downstream plant element simulation module to illustrate one manner in which a pipe simulation module can implement mass flow balancing using upstream and downstream simulation variables. As will be seen, the example simulation system 300 of FIG. 4 includes two superheater plant element simulation modules 302 and 304 interconnected by a pipe simulation module 306. The outlet of the first (upstream) superheater simulation module 302 and the inlet of the second (downstream) simulation module 304 are connected in the flow path to the input and the output of the pipe module 306, respectively, using a flow path pin. This configuration allows various flow stream values to be passed between the algorithms of the simulation modules 302-306 as a vector of information and also allows the pipe simulation algorithm to have access to the calculated output pressure of the downstream connected model algorithm of the simulation module 304.

Generally speaking, the algorithms associated with the plant element simulation modules 302 and 304 calculate an outlet variable, such as pressure, in a manner that uses downstream (and possibly upstream) variable values, to thereby provide for a more accurate simulation as process variables such as pressure and flow rate are reconciled across multiple simulation modules using this technique. For example, the pipe modeling algorithm within the pipe simulation module 306 is constructed to reconcile flow rates between the different components (in this case between the superheaters 302 and 304), and the output pressure $P_x$ of the pipe simulation module 306 serves as the key reconciliation factor.

During operation, the models run in the superheater simulation modules 302 and 304 calculate the outlet pressures denoted $P_1$ and $P_2$ for the superheater 302 and the superheater 304, respectively. The input pressure for superheater 304 is denoted as $P_x$.

In this example, the algorithm of each simulation module 302 and 304 publishes its calculated output pressure as part of the algorithm shared memory in a manner described in more detail below. As a result, the outlet pressure of any particular component is accessible to the algorithm that is connected directly ahead (upstream) of it in the flow path as well as being accessible to the algorithm that is connected directly behind (downstream) of it in the flow path. In the simulation arrangement of FIG. 4, the superheater model for the simulation module 304 calculates the output pressure $P_2$, while the superheater model for the simulation module 302 calculates the output pressure $P_1$. If the pipe element 306 is assumed to be lossless, the pressures $P_1$ and $P_x$ should be identical. In the case of a non-lossless pipe, the two pressures $P_1$ and $P_x$ will not be equal, but will differ by the pressure difference between the two ends of the pipe element (or the pressure loss across the pipe element).

However, because each equipment model (or each model of a section of equipment) is computed individually, there is no guarantee that the outlet flow of a particular piece of equipment will be equal to the inlet flow of the next downstream equipment at each sampling time. Therefore, a reconciliation mechanism has to be in place to ensure that these mass flow rates match. This mechanism is implemented through the calculation of the outlet pressure $P_x$ within the connecting pipe simulation module 306. One set of calculations which may be performed by the pipe simulation module 306 to reconcile the pressures and mass flow between the simulations modules 302 and 304 of FIG. 4 will be discussed below.

In this case, equation (1) sets the mass flow into the pipe element 306 and the mass flow out of the pipe element 306 equal to one another, which must be the case in steady state situations with a lossless pipe.

$$\dot{m}_{in} = \dot{m}_{out} \quad (1)$$

For each pipe element in the simulation, the relationship in equation (1) is assumed to be valid at steady state. That is, the mass flows in and mass flows out of the pipe are equal. However, the mass flow through the pipe element 306 can be expressed as a function of the square root of the pressure difference between two points in the flow path. This quadratic relationship between pressure and flow is an important consideration, as it more accurately models the physical operation of the plant. This relationship is shown for the first superheater 302 of FIG. 4 in equation (2) below.

$$\dot{m}_1 = K_{pipe} \cdot \sqrt{(P_1 - P_x)} \quad (2)$$

Likewise, the mass flow through the second superheater 304 of FIG. 4 is given by equation (3).

$$\dot{m}_2 = K_{sh2} \cdot \sqrt{(P_x - P_2)} \quad (3)$$

In both equations (2) and (3), each of the K values represents the conductance of the corresponding component and is a function of the physical properties of the associated component. These K values can be calculated from the physical data for the component, can be determined by empirical test data or in any other desired manner, and these values may be included in the configuration parameters for the pipe modeling algorithm used in the pipe simulation module 306. Now, the pressure $P_x$ can be calculated by substituting equations (2) and (3) into equation (1) resulting in:

$$P_x = \frac{p_1 \cdot (K_p)^2 + p_2 \cdot (K_{sh2})^2}{(K_p)^2 + (K_{sh2})^2} \quad (4)$$

Here, the pressure $P_x$ is a weighted average of the pressures $P_1$ and $P_2$. Once the pressure $P_x$ is obtained, the corresponding flow rates at both ends of the pipe element 306 can be calculated using equations (2) and (3), a process referred to as flow reconciliation. It is important to note that this calculation does not assume flow directions are known a priori. Instead, the flow directions are totally dependent on the difference between values of the pressures $P_1$ and $P_2$. Still further, as will be understood, the operation of the pipe element 306, in calculating the inlet pressure $P_x$ of the second superheater simulation element 304, as well as the mass flow rates into and out of the second superheater simulation element 304 balances the mass flow and pressure equations between the simulation elements 302 and 304, thereby assuring an accurate simulation of the entire system, despite various of the models being executed in separate computing devices.

If desired, dynamics can be attached to the pressure and mass flow calculations performed by the pipe simulation element 306 using, for example, low pass filters. In this case, the dynamics of the pipe outlet pressure and flow can be attached by passing the computed pressure $P_x$ through a low-pass filter. Preferably, the filter parameters should be tunable to allow for different dynamics to be modeled.

In any event, it is important to note that the reconciliation process implemented by the pipe simulation module 306 adjusts or calculates flow from the exit of the upstream module 302 to the output of the downstream module 304 based on the pressures at these points, as determined by the models within the simulation modules 302 and 304. Moreover, because the pipe algorithm in the pipe simulation module 306 uses a pressure associated with the downstream element, in this case the outlet of the downstream element 304, to calculate the flow exiting the upstream element, and in some cases to adjust the pressure at the output of the upstream element, changes in the operation of the downstream element 304 are inherently communicated to the upstream element, which will use the mass flow rate and output pressure in its next computational cycle. Thus, changes in variables, such as mass flow, pressures, temperatures, etc., in a downstream element are propagated upstream during successive simulation cycles, and are reflected in the modeling of the upstream element during the next simulation execution cycle of the upstream element. In some cases these pressure, flow and temperature variable values may be communicated between adjacent simulation nodes multiple times during any given execution cycle of the simulation system.

Figure 5:
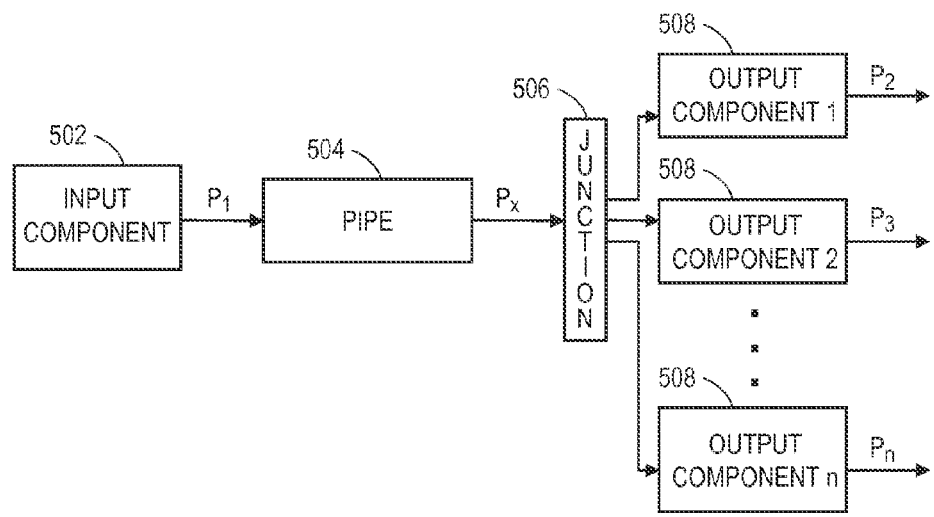
FIG. 5 illustrates a pipe simulation module that is communicatively connected between a plant simulation module and a junction module in the form of a splitter simulation module which is, in turn, connected to three downstream plant element simulation modules and that performs mass flow balancing between the upstream and downstream plant element simulation modules.

A more generic modeling example will now be illustrated in conjunction with FIG. 5 in which a pipe simulation module is used to model the operation of a flow splitter device in conjunction with downstream components. In this case, an inlet component (upstream component) 502 is connected to the inlet of a pipe element 504, and the outlet of the pipe element 504 is connected to a splitting (or mixing) junction element 506. The splitting junction element 506 is modeled such that all pressure measurements at the junction inlets and outlets are the same. As in the example of FIG. 4, the input simulation component 502 and all of the output simulation components 508 (downstream of the splitting junction 506) compute or perform their associated model calculations individually in a sequential manner. These components can represent or model any equipment or any section of equipment including an actual pipe itself. In order to formulate a set of easily solvable equations, and without the loss of generality, it is assumed that directions of all of the flows around the junction 506 are known a priori. The following derivation assumes flow directions as shown by the arrows in FIG. 5.

It is assumed that the mass flow at the inlet of the pipe element 504 and at the outlet of the pipe element 504 are equal at steady state. This flow value is also equal to the summation of all of the junction outlet flows (mass balance) of the junction element 506. Thus:

$$\dot{m}_1 = \sum_{i=2}^{n} \dot{m}_i \quad (1A)$$

The equation for calculating the pipe inlet flow is the same as equation (2) above, and can be re-written in this case as follows:

$$\dot{m}_1 = K_1 \sqrt{P_1 - P_x} \quad (2A)$$

Where $K_1$ is the pipe conductance.

The equation for calculating each of the mass flows after the junction split is derived in a manner similar to equation (3).

$$\dot{m}_i = K_i \sqrt{P_x - P_i} (i=2, \ldots, n) \quad (3A)$$

where $K_i$ is the corresponding equipment conductance.

Therefore, according to equation 1A, $$K_1 \cdot \sqrt{P_1 - P_x} = \sum_{i=2}^{n} K_i \cdot \sqrt{P_x - P_i} \quad (5)$$

This equation has to rely on a nonlinear solver to obtain the value of $P_x$. One method of solving this equation for $P_x$ is as follows:

Step 1: Initialization
If the computation is in the first pass, then $$P_x = \frac{\sum_{i=1}^{n}(P_i \cdot K_i^2)}{\sum_{i=1}^{n} K_i^2} \quad (6)$$

Otherwise, an initial $P_x(k) = P_x(k-1)$.

Step 2: Linearization
Linearization allows solving for an approximate $P_x$ in a quick manner. This quickly solved $P_x$ can be used as the initial value for the next step in the nonlinear solving process, or it can be used directly as the final solution.

Step 2.1: Choose $P_x(k)$ obtained from Step 1 as a linearization operating point. Let $P_x(k)$ be defined as $P_0$. Also, for notational convenience, let $f = \dot{m}$. In this case, flow rates at the linearization operating point can be calculated as:

$$f_{10} = K_1 \sqrt{P_1 - P_0}$$

$$f_{i0} = K_i \sqrt{P_0 - P_i} (i=2, \ldots, n)$$

Where $P_1$ and $P_i$ are the latest available calculations of the pressure variables (depending on the algorithm execution order).

Step 2.2: For flow rates within the linearization region:

$$K_1^2(P_1 - P_x) = f_1^2 \approx f_{10}^2 + 2f_{10}(f_1 - f_{10}) \Rightarrow f_1 = \frac{K_1^2(P_1 - P_x) + f_{10}^2}{2f_{10}}$$

$$K_i^2(P_x - P_i) = f_i^2 \approx f_{i0}^2 + 2f_{i0}(f_i - f_{i0}) \Rightarrow f_i = \frac{K_i^2(P_x - P_i) + f_{i0}^2}{2f_{i0}}$$

$$(i = 2, \ldots, n)$$

According to equation 1A:

$$\frac{K_1^2(P_1 - P_x) + f_{10}^2}{2f_{10}} = \sum_{i=2}^{n} \frac{K_i^2(P_x - P_i) + f_{i0}^2}{2f_{i0}}$$

$P_x$ can now be solved as:

$$P_x = \frac{\left\{\sum_{i=1}^{n}\left(\frac{K_i^2 P_i}{2f_{i0}} + \frac{f_{i0}}{2}\right)\right\}}{\sum_{i=1}^{n} \frac{K_i^2}{2f_{i0}}}$$

This $P_x$ can be used as the solution directly, or can be used as the initial condition for the next step.

Step 3: Use $P_x$ solved from previous step as an initial condition, and solve equation (5) for $P_x$. Of course, once the value of $P_x$ is computed, the mass flows through the pipe element 504 and each of the downstream elements 508 can be easily determined.

As a special case of the generic situation presented above, a more common scenario is a three-way junction used in piping configurations. In this situation, the value of $P_x$ can be obtained in a closed analytical form. The computational derivation can be outlined as following:

Beginning with the mass balance equation:

$$K_1 \sqrt{P_1 - P_x} = K_2 \sqrt{P_x - P_2} + K_3 \sqrt{P_x - P_3}$$

the equation below is obtained:

$$A \cdot P_x^2 + B \cdot P_x + C = 0$$

Where:

$$A = K_1^4 + K_2^4 + K_3^4 + 2K_1^2 K_2^2 + 2K_1^2 K_3^2 - 2K_2^2 K_3^2$$

$$B = -2 \cdot (K_1^4 P_1 + K_2^4 P_2 + K_3^4 P_3 + K_1^2 K_2^2 P_1 + K_1^2 K_3^2 P_1 + K_2^2 K_1^2 P_2 + K_3^2 K_1^2 P_3 - K_2^2 K_3^2 P_2 - K_2^2 K_3^2 P_3)$$

$$C = K_1^4 P_1^2 + K_2^4 P_2^2 + K_3^4 P_3^2 + 2K_1^2 K_2^2 P_1 P_2 + 2K_1^2 K_3^2 P_1 P_3 - 2K_2^2 K_3^2 P_2 P_3$$

$P_x$ can then be solved using the standard quadratic equation formula:

$$P_x = \frac{-B \pm \sqrt{B^2 - 4AC}}{2A}$$

For a splitter junction in this case, the minus sign in front of the square root in the above equation is selected.

Although the above equation is written for a splitting junction, a mixing junction algorithm can be written in a straightforward and similar manner, except the plus sign in front of the square root is selected. Of course, once the pressure $P_x$ has been solved, the mass flows can be computed to reconcile mass flow from the upstream element through the splitting junction to the downstream elements.

While a couple of example mass flow rate and pressure balance algorithms have been described herein for use in pipe simulation modules, similar mass flow and pressure balance algorithms can be developed for other types of components to be used in a simulation system as described herein, including for example, tanks, heat exchangers, etc. A technique that may be used to determine pressures and flows through junction nodes (at which flows either converge or diverge) other than simple splitter or mixer junctions will be described with respect to FIGS. 9 and 10A-10D.

In one case, a tank model may implement pressure and flow rate balancing using downstream component variables to perform pressure, temperature or mass flow balancing between or across adjacent simulation modules. In the tank model, the mass balance equation may be written as:

$$dM/dt = m\_in - m\_out$$

where "d" stands for derivative, M is the total mass in the tank, t is the time, m_in is the flow that comes into the tank, and m_out is the flow going out of the tank.

Calculation of the inlet and outlet flows can be performed by the following piping formulas:

$$m\_in = K_1 * (P\_in - P\_tank\_in)^{1/2}$$

$$m\_out = K_2 * (P\_tank\_out - P\_next)^{1/2}$$

where $K_1$ and $K_2$ are the inlet flow conductance of the tank unit and the next connected unit, P_in is the inlet pressure at the tank inlet pipe inlet, P_tank_in is the pressure at the tank inlet pipe outlet, P_tank_out is the pressure at the tank outlet pipe inlet, and P_next is the pressure at the tank outlet pipe outlet. In this case, the outlet pipe is the next downstream module. Thus, here, P_next is the pressure information for the downstream unit illustrating again in this case how downstream information gets incorporated by the tank simulation module to thereby provide feedback from downstream elements to upstream elements.

In any event, sets of mass flow rate and pressure balance equations can be derived and used for various other simulation components, including sensors (e.g., pressure, flow, temperature, etc. sensors), boundary conditions from the left (upstream), boundary conditions to the right (downstream), a general motor, a general tank, a general pipe (for steam, water, etc.), a junction, (general water/steam junction), a duct (e.g., for air or flue gas), a general air/flue gas junction, a general purpose valve (e.g., for steam/water), a general purpose damper (e.g., for air/gas), a general purpose centrifugal pump, a general purpose centrifugal fan (for use in either forced draft or induced draft systems) a general purpose axial fan, a furnace (of many different types), a steam drum, a popular horizontal feedwater heater, a deaerator, a heat exchanger (for a superheater and/or a reheater), a general purpose condenser, a cooling tower, a pulverizer (e.g., a general purpose bowl mill), a turbine, a mechanical shaft (lumped), an electrical generator, an electric circuit breaker, a synchronization scope, a flow splitter, a flow splitter junction, a flow mixer, a flow mixer junction, a steam seal condenser, a check valve, an air pre-heater or any other number of plant elements.

While the above simulation approach works well in steady state conditions to enable accurate distributed simulation using a set of distributed simulation modules without the need for a central coordinator, it is sometimes desirable to modify this technique slightly to account for or enable accurate simulations during dynamic conditions. In particular, in some instances, it may be beneficial to implement what is referred to herein as a transient mass storage relay (TMSR) technique when performing a distributed simulation using the piping concept described above. The TMSR technique is particularly useful in handling total mass imbalance problems that might be encountered when performing the sequential simulation mechanism described above during dynamic conditions and/or when simulating closed loop or circular systems.

Figure 6:
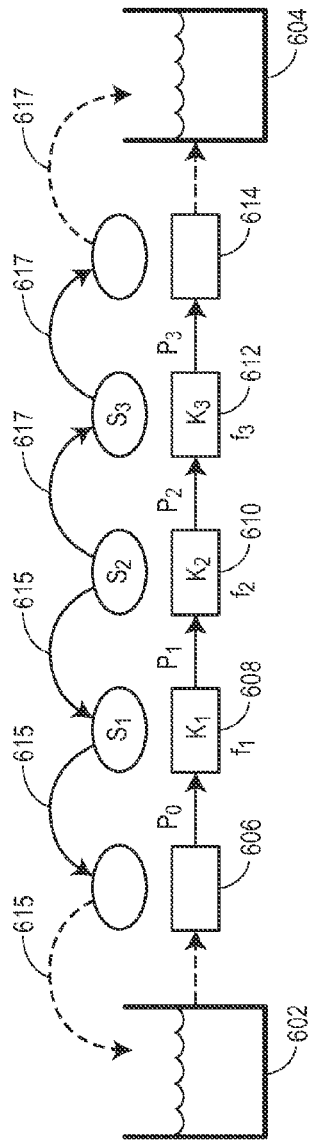
FIG. 6 illustrates a set of non-mass storage simulation modules connected between upstream and downstream mass storage simulation modules to illustrate a manner of accounting for mass discrepancies arising from simulating mass flow during transient or dynamic conditions within a plant.

The need for and the manner of implementing the TMSR technique is illustrated in more detail using the simulation diagram 600 of FIG. 6 in which mass flow travels or flows from an upstream storage device 602 (a tank is used as an example here) to a downstream storage device 604 (a second tank is used as an example here) through a series of non-storage devices 606, 608, 610, 612, 614. Here, pipes are used as examples of the non-storage devices 608-612, although other types of devices that do not perform mass storage could be used in the simulation as well or instead. Without loss of generality, the conductances of the pipes (pipe 1, pipe 2 and pipe 3, respectively) associated with the pipe simulation elements 608-612 are illustrated in the example system of FIG. 6 as $K_1$, $K_2$ and $K_3$, respectively, the flow through the pipes pipe 1, pipe 2 and pipe 3 are denoted as $f_1$, $f_2$, and $f_3$, respectively, and the inlet and outlet pressures of the three pipes associated with the simulation elements 608-612 are denoted as $P_0$, $P_1$, $P_2$ and $P_3$, respectively.

At any given moment, the outlet flow of one particular pipe should be equal to the inlet flow of the connected downstream pipe, i.e., $f_{i\_out} = f_{(i+1\_\_in)}$. Within any given computer sampling time, the execution order is assumed to follow the order of device line-up from the upstream elements to the downstream elements. For example, the simulation module 608 for pipe 1 would be executed before the simulation module 610 for pipe 2, etc. In the following discussion, a top hat denotes the current updated calculation result as opposed to a result computed at a previous sampling time. For example, $\hat{P}$ denotes the current updated value as opposed to a previously calculated value of P.

Based on definitions set forth above, the calculations of pressure and flow for each individual component, beginning from pipe 1, can be laid out as follows (in the order of execution):

$$\hat{P}_1 = \frac{K_1^2 \hat{P}_0 + K_2^2 P_2}{K_1^2 + K_2^2} \qquad (7)$$

$$F_{1\_in} = K_1 \sqrt{\hat{P}_0 - \hat{P}_1}$$

$$F_{1\_out} = K_2 \sqrt{\hat{P}_1 - P_2}$$

$$\hat{P}_2 = \frac{K_2^2 \hat{P}_1 + K_3^2 P_3}{K_2^2 + K_3^2} \qquad (8)$$

$$F_{2\_in} = K_2 \sqrt{\hat{P}_1 - \hat{P}_2}$$

$$F_{2\_out} = K_3 \sqrt{\hat{P}_2 - P_3}$$

In the ideal case:

$$F_{1\_in} = F_{1\_out} = F_{2\_out}$$

However, this condition is only true during steady state. During a dynamic transition, $P_2 \neq \hat{P}_2$. Therefore, comparing sets of equations (7) and (8) leads to $$F_{1\_in} = F_{1\_out} \neq F_{2\_in} = F_{2\_out}$$

This condition of course produces mass imbalances during dynamic transients and such imbalances will be reflected in the simulation in one or both of two manners. First, the simulation may end up with slightly different solution than a simulation that solves all of the equations simultaneously. In this case, the amount of out-of-balanced mass may be shifted (or appears to be "leaked") from one storage device to another storage device. Second, for a closed-circulation system, this situation may operate to make it appear that the total mass in the system increases or decreases over a long period of sustained dynamic transient. As the chosen sampling time gets smaller, the amount of mass imbalance starts to diminish accordingly. However, an arbitrary small sampling time is prohibited (i.e., is not possible to obtain) by an actual computer implementation.

To correct for this mass imbalance artifact arising during dynamic transients, the TMSR technique introduces a transient mass storage for each non-storage component (e.g., for each pipe). For example, the transient mass storage for pipe 2 can be defined as:

$$S_2 = F_{1\_out} - F_{2\_out}$$

Once defined, the transient mass storage can be handled as follows. During a dynamic transient (for example, when a valve moves), there will always be some amount of mass imbalance. If the transient mass storage S for an element (e.g., a pipe) is positive, then the simulation module for that element dumps this mass storage to the immediate upstream device, while if the transient mass storage S is negative, then the simulation system dumps this transient mass to the immediate downstream device. After a non-storage device dumps its transient mass storage to an upstream or a downstream device, the device resets its transient mass storage associated therewith to zero. (Of course, an upstream device means the device in the direction against the normal flow path and a downstream device means the device in the direction of the normal flow path). Every algorithm (simulation module) for each non-storage device performs this same procedure during each execution cycle so that, eventually, the transient mass storage reaches a mass storage device (e.g., a tank). Here, a mass storage device is a component (having a simulation algorithm) that can explicitly process the equation dM/dt=flow_in−flow_out (where M is the total mass inside that device). For example, simulation modules for tanks, drums, heat exchangers, etc. can perform this operation. In this manner, all lost or gained mass leakages (in non-storage devices) will return to where this mass belongs (i.e., in a storage device), and the user will not see these balancing actions from the front end because all other piping calculations continue as usual at the same time. Thus, in the example of FIG. 6, a positive transient mass storage $S_2$ calculated in the pipe simulation element 610 will be transferred to the simulation element 608 (upstream), as illustrated by the arrow 615. Because the simulation element 608 is simulating a non-storage device (e.g., a pipe), during its next execution cycle, the simulation element 608 dumps its positive transient mass storage $S_1$ to the upstream simulation element 606. Of course, the transient mass storage $S_1$ will include transient mass storage dumped from the simulation module 610 in the previous cycle as well as any new mass imbalances calculated for the current execution cycle of simulation module 608. Thus, the transient mass storage $S_1$ may be different than the transient mass storage $S_2$. As illustrated by the upstream arrows 615, the transient mass storage $S_2$, when positive, is eventually transferred to the simulation module 602, which simulates a mass storage device (e.g., a tank) which can process this transient mass during its next execution cycle.

In a similar manner, a negative transient mass storage $S_2$ calculated in the pipe simulation element 610 will be transferred to the simulation element 612 (downstream), as illustrated by the arrows 617. Because the simulation element 612 is simulating a non-storage device (e.g., a pipe), during its next execution cycle, the simulation element 612 dumps its negative transient mass storage $S_3$ (which may be the transient mass storage $S_2$ plus additional transient mass storage calculated as a result of the operation of the pipe simulation module 612) to the downstream simulation element 614. As illustrated by the downstream arrows 617, the transient mass storage $S_2$, when negative, is eventually transferred to the simulation module 604, which simulates a mass storage device (e.g., a tank) which can process this transient mass during its next execution cycle.

The rule for this transient mass storage relay approach, when used in the system of FIG. 6, can be simply summarized by the following pseudo-code.

```
IF Ŝ₂ > 0
   THEN   Ŝ₁ = S₁ + Ŝ₂
          Ŝ₂ = 0
   ELSE
          Ŝ₃ = S₃ + Ŝ₂
          Ŝ₂ = 0
```

Figure 7:
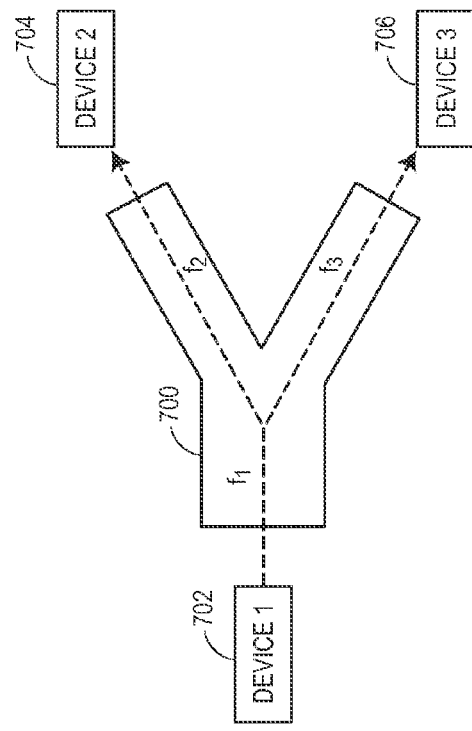
FIG. 7 illustrates a flow junction simulation module, in the form of a splitter, disposed between upstream and downstream plant element simulation modules to illustrate a manner of accounting for mass discrepancies arising from mass flow during transient or dynamic conditions through a splitter.

The TMSR technique can also be used in a splitter device, such as that illustrated in FIG. 5. In particular, FIG. 7 illustrates a splitter device 700 which connects an input device 702 (Device 1) to two downstream output devices 704, 706 (Devices 2 and 3). Flow $f_1$ comes into the splitter junction 700 from the input device 702 and splits into two outgoing flow streams labeled as flows $f_2$ and $f_3$. Here, the transient mass storage in each of the devices 702, 704 and 706 can be denoted as $S_1$, $S_2$ and $S_3$, respectively, and the transient mass storage in the splitter can be denoted as S. The transient mass storage in the splitter junction is then:

$$S = f_1 - f_2 - f_3$$

A TMSR rule for this splitter junction module can then be described by the following pseudo code:

```
IF Ŝ > 0
   THEN   Ŝ₁ = S₁ + Ŝ
          Ŝ = 0
   ELSE
          Ŝ₂ = S₂ + (f₂/f₁)Ŝ
          Ŝ₃ = S₃ + (f₃/f₁)Ŝ
          Ŝ = 0
```

In the above described example, the transient mass storage determined in the splitter junction 700 gets relayed to the downstream devices 704 and 706 in a manner that is proportionally distributed according to the outlet branch flow as a percentage of the total inlet flow. Of course, the TMSR approach described herein can similarly be applied to a mixer junction, as well as to any junctions or other devices that have more than two inlets or outlets.

As illustrated in FIG. 3, each of the distributed simulation modules 42 includes one or more memories 210 used for use in communications between adjacent (i.e., immediately connected upstream and downstream) simulation modules, to enable direct communications between these modules without the use of a central coordinator. In particular, these direct communications can be implemented to provide data calculated in or associated with one simulation module that is needed in the adjacent simulation module (upstream and/or downstream) to perform the modeling tasks in the adjacent simulation module. This data may include, for example, simulation module inputs and outputs and various internal parameters including, for example, calculated input and output pressures (e.g., pressures $P_0$, $P_1$, $P_2$, $P_n$ and $P_x$ of FIGS. 4 and 5), flow rates (e.g., mass flow rates through the pipe and downstream components of the pipes in FIGS. 4 and 5, the flow rates $f_1$, $f_2$, etc. of FIGS. 6 and 7), transient mass storage values (e.g., transient mass storage values $S_1$, $S_2$, etc. of FIG. 6), temperatures, or any other process variable values, set points, configuration settings, etc., associated with one simulation element that is needed by an adjacent simulation element to perform modeling using the concepts described above.

In particular, the memories 210 are used by the simulation modules or the processors executing the simulation modules to perform local memory exchanges between different drops or different simulation modules. The mechanism used for this local memory exchange task may be similar to a task running on the processor that performs a copy to a backup (which task occurs at regularly scheduled intervals and simply copies data to a known memory location for backup purposes). In this case, however, the processor executing a particular simulation module copies predetermined data values (e.g., input and/or output pressures, mass flow values, transient mass storage values, etc.) to a known memory location that is associated with (and used by) an upstream or a downstream simulation module. Of course, different data may be copied to different simulation modules, as it is only necessary to copy the data from one simulation module to an upstream or downstream simulation modules that is needed by the upstream or downstream simulation module. The data that will be copied in any particular case can be set up or specified during configuration of the simulation system. Thus, instead of copying a large amount of local data between a primary location and a back-up drop, the simulation communication technique described herein requires only a small amount of local memory data transfer, mainly for simulation algorithms that connect between drops.

As will be understood, when simulation modules are disposed in separate processing devices, or even in the same processing device, adjacent simulation modules communicate data upstream and downstream by simply writing the data into a memory location assigned to or associated with the respective upstream or downstream simulation module, making that data immediately available to the upstream or downstream simulation module when that simulation module executes. Of course, data can be communicated to a memory within the same processing device or to a memory in a different processing device, via a communication network disposed between the two different devices. This communication mechanism is simple, as each simulation module communicates the most recent data from that simulation module to the upstream and downstream simulation modules which use that data, without the need for a large amount of communication overhead and without the need to send a large amount of data between any two devices (or even between any two simulation modules).

Moreover, the process of communicating using the local memory in the drops 210 can be implemented in the same manner that an actual process controller performs a copy to backup task, in that this communication task runs in parallel to all other control tasks. However, in a virtual controller (i.e., a simulated controller), the copy to backup task is not needed and therefore this task can be replaced by a simulation local memory copy task (referred to herein as the SIMLMCPY task) which executes periodically in the processor as a dedicated background task to copy the needed data between simulation modules in the virtual controller device or between different drops having adjacent simulation modules therein.

Figure 8:
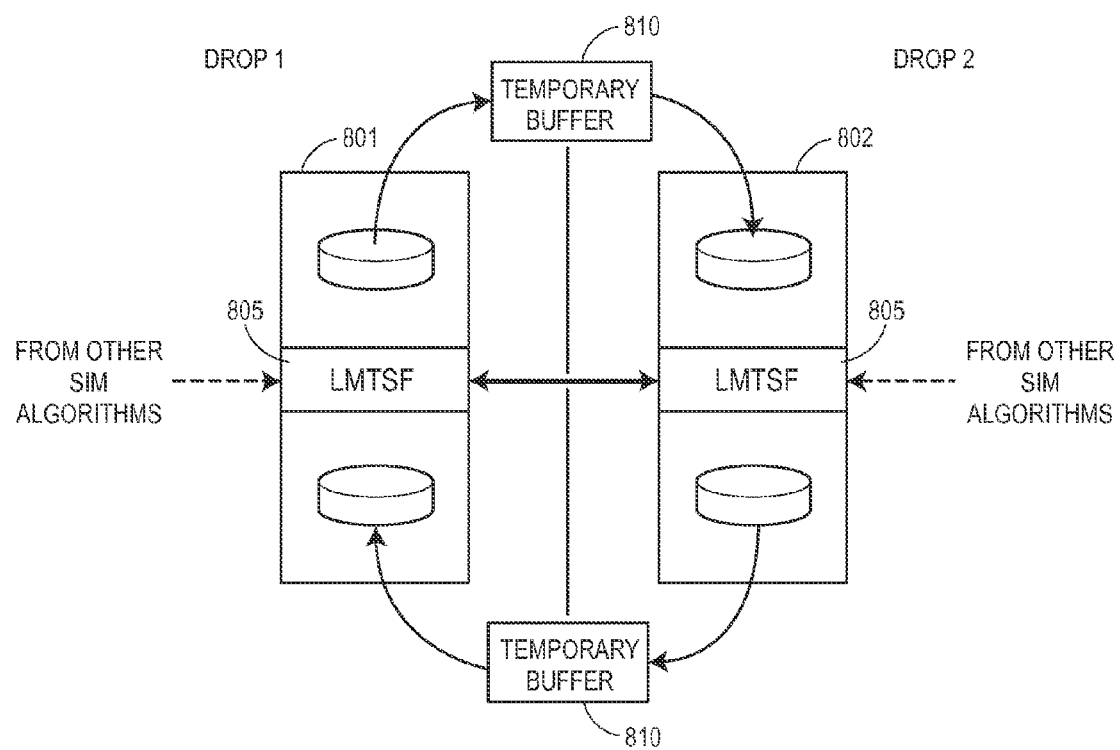
FIG. 8 illustrates a manner of communicating between adjacent distributed simulation modules that reside in different distributed control system drops or computing devices that can be used in the distributed simulation system of FIG. 1.

In one case, this communication technique may be implemented by the following procedure illustrated in conjunction with FIG. 8 which illustrates the local memories 210 of two adjacent simulation modules 801 and 802 which are disposed in different drops (e.g., different processing devices). A dedicated local memory transfer algorithm (LMTSF) 805 is created for and is associated with each of the simulation modules 801 and 802. The LMTSF algorithm 805 is used for connecting simulation drops only, and acts like a memory buffer. The LMTSF algorithm 805 is placed in both the originating drop and the receiving drop and the two algorithms know each other by a unique identification (ID). This ID is not however, an SID or an LID. Instead, this ID number may be placed into each algorithm 805 (perhaps in a certain field) by the user, at the time that the simulation system is created or at the time that the simulation modules 801 and 802 are created or downloaded to the drops. Upon down-load, all LMTSF algorithms 805 and their associated ID numbers register with a simulation local memory copy (SIMLMCPY) task run in the processor, so that the SIMLMCPY task performs local memory exchange using the LMTSF algorithm when the SIMLMCPY task runs as a background task in the processor.

Thereafter, at each loop-time or other time interval, the SIMLMCPY task in the processor of a drop copies the local memory from each originating LMTSF to a temporary buffer (illustrated as buffers 810 in FIG. 8), and then to the corresponding receiving LMTSF. The same action is performed from the receiving LMTSF to the originating LMTSF thereby assuring that each originating and receiving pair (upstream and downstream simulation modules) communicate the needed data to one another. Moreover, this process is performed between each pair of adjacent simulation modules, so that, between each execution cycle of the simulation system, each set of adjacent simulations modules communicates data therebetween at least once and possibly more times, which data is needed or used by the receiving simulation module to perform modeling during that or the next execution cycle. This communication system eliminates the need for a central coordinator to track communication flow or process flow between all of the simulation modules in different drops, as each simulation knows and is able to communicate directly with the simulation modules connected immediately upstream and downstream of that simulation module.

Of course, the communication scheme described above assumes that the SIMLMCPY task can sort through all of the simulation algorithms in a particular simulation node and find the connected LMTSF algorithms by their unique identification numbers. This communication scheme also assumes that the SIMLMCPY task can access the local memory space of the LMTSF algorithm of each simulation module by the drop number and algorithm SID, and then the LID. Of course, other manners of performing communication between adjacent simulation modules can be used as well or instead to assure communications between the different simulation modules associated with the distributed simulation system.

Figure 9:
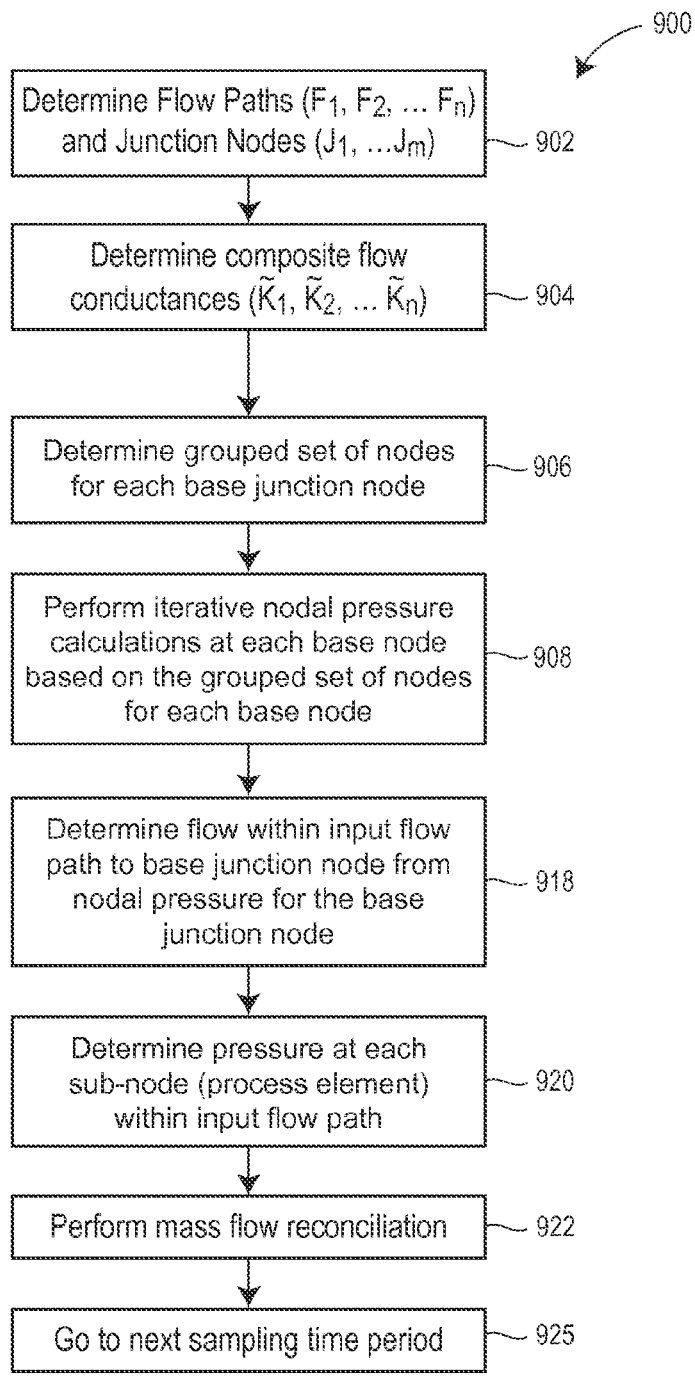
FIG. 9 illustrates a flow chart associated with a node grouping and pressure calculation technique used to efficiently solve for pressure and flow variables in a process network having one or more junction nodes at which flows converge or diverge.
Figure 10:
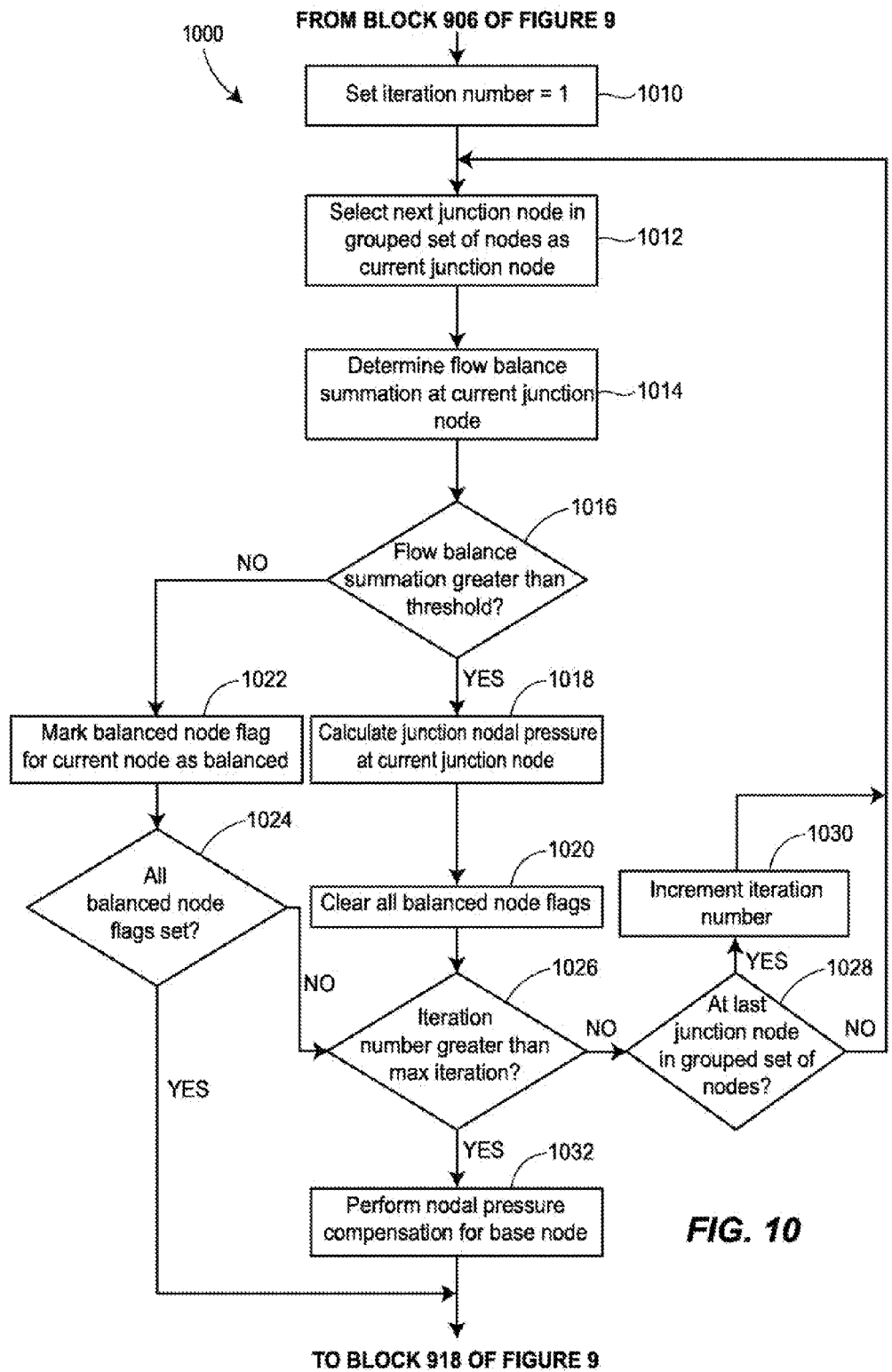
FIG. 10 illustrates a flow chart associated with an iterative pressure determination and flow calibration technique that may be used at each of a set of simulation drops to determine a pressure at each of a set of junction nodes of a process network.
Figure 12A:
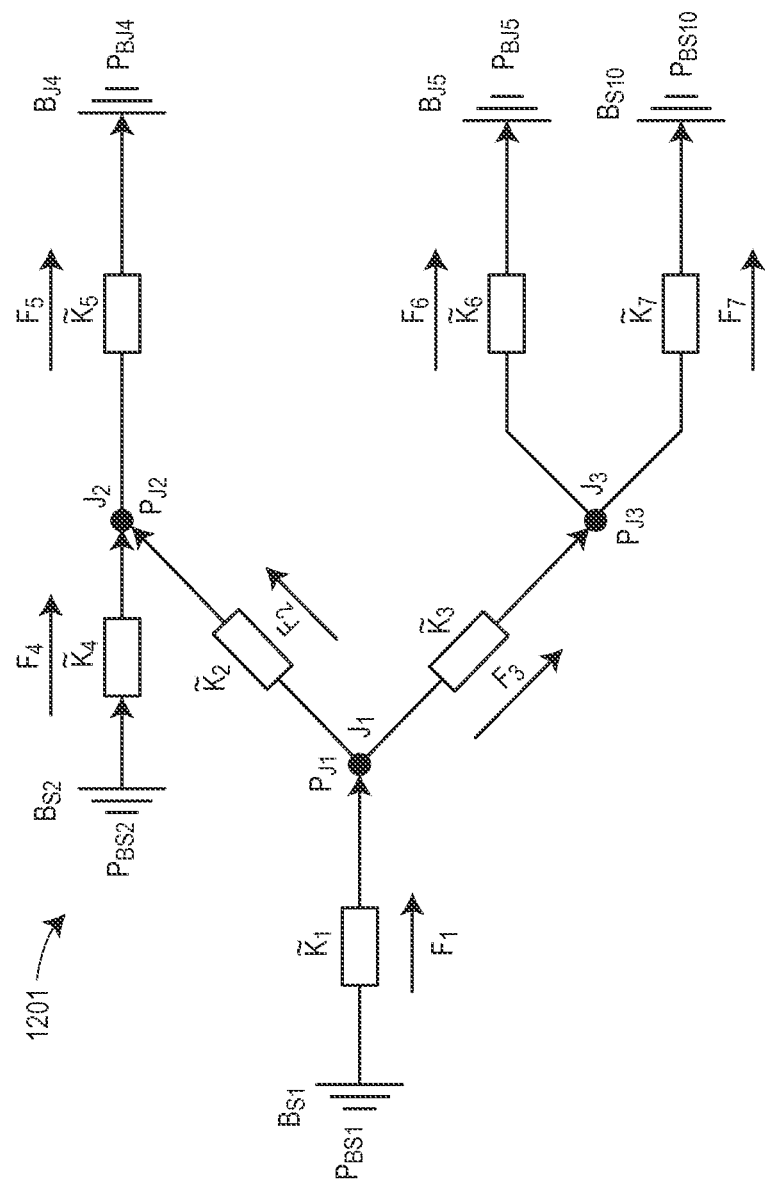
FIG. 12A illustrates a set of grouped nodes associated with a first one of the junction nodes of FIG. 11B determined by a node grouping technique when the first junction node is selected as a base junction node.
Figure 12B:
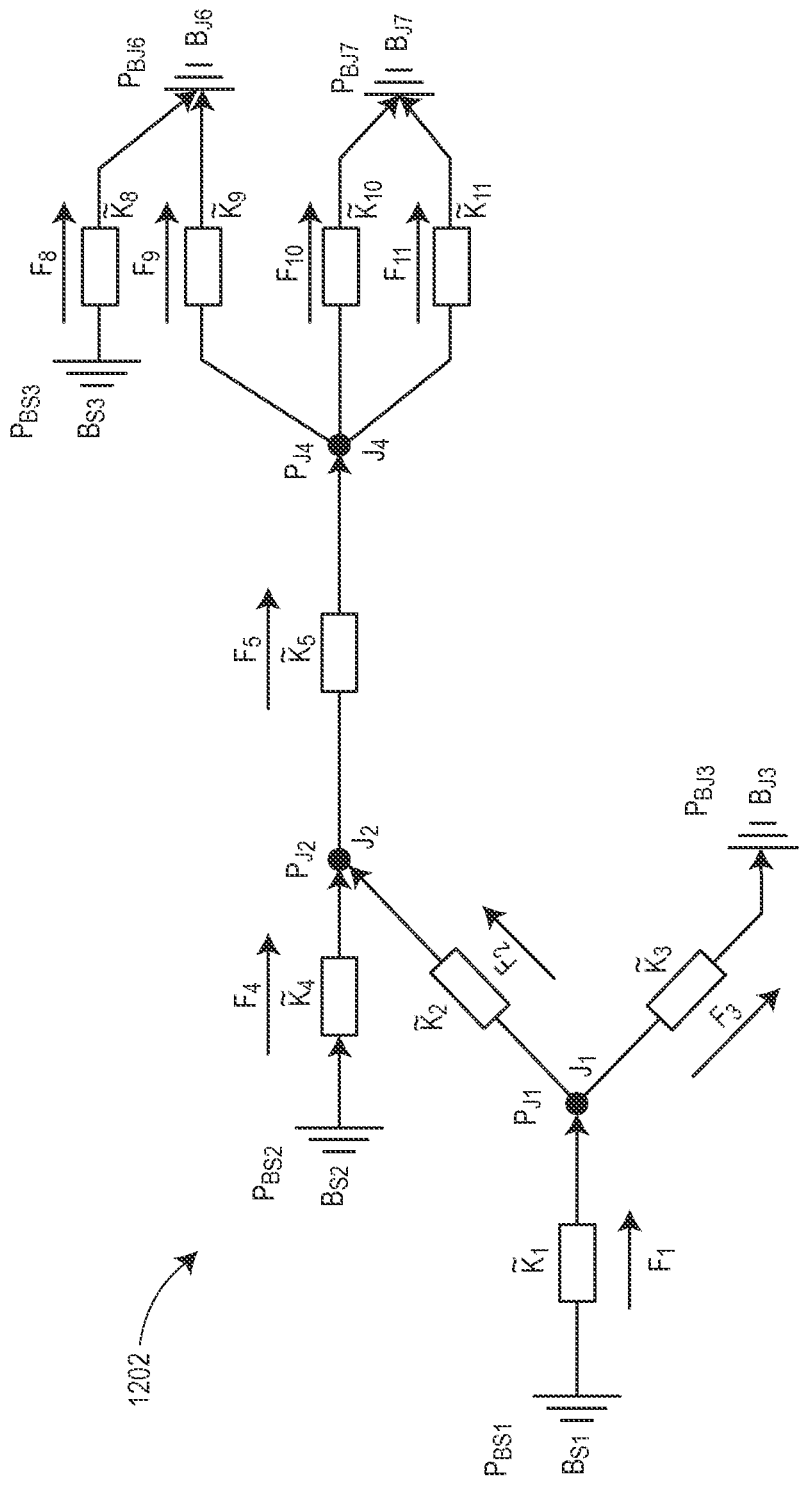
FIG. 12B illustrates a set of grouped nodes associated with a second one of the junction nodes of FIG. 11B determined by a node grouping technique when the second junction node is selected as a base junction node.
Figure 12C:
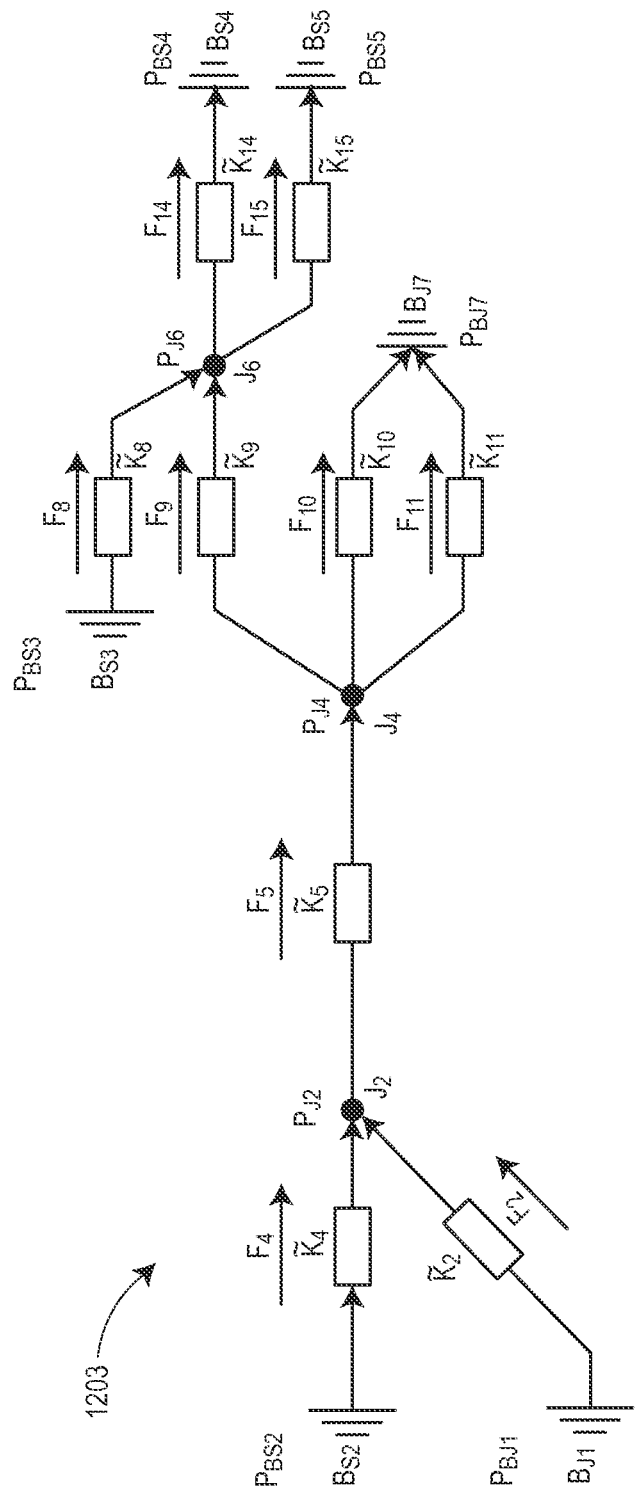
FIG. 12C illustrates an alternative set of grouped nodes associated with the second one of the junction nodes of FIG.
Figure 13:
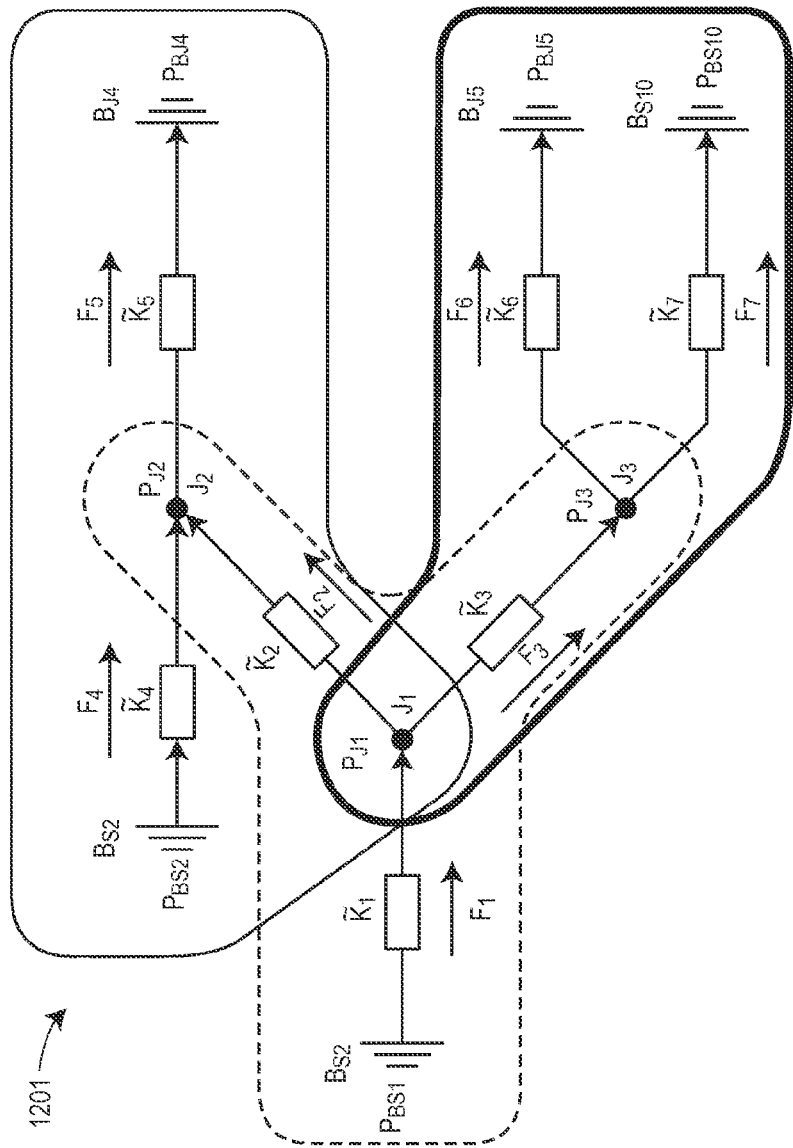
FIG. 13 illustrates a manner of using various subsets of the set of grouped nodes associated with the first one of the junction nodes depicted in FIG. 12A to perform an iterative technique for determining a pressure at the first one of the junction nodes.

Referring now to FIGS. 9-13, an enhanced methodology for determining or calculating pressures and flows at various nodes or drops of a simulation system that simulates a process network having junction nodes (i.e., nodes at which fluid flow converges or diverges) uses a pressure and flow variable determination technique generally illustrated in FIGS. 9 and 10 and described in conjunction with the example process network flow diagrams of FIGS. 11-13. Generally, this pressure and flow calculation technique uses a process network simplification routine to create a simplified or composite process network, a node grouping technique that selects a group of nodes from the process network or the composite process network for one or more of the junction nodes within the process network (with the selected group of nodes typically being a subset of nodes that is less than all of the process network nodes), and a grouped node iterative pressure calculation technique that may be used for each of the grouped set of nodes to determine pressures at the one or more junction nodes of the process network. If desired, the method may also perform a flow-based pressure calibration technique for one or more of the junction nodes to provide more accurate pressure and flow calculations during the grouped node iterative pressure calculation technique at each of a number of simulation nodes of a process network. As will be understood, the enhanced pressure and flow determination technique described herein can be advantageously used in process networks that have junction nodes at which fluid flow converges or diverges, to perform accurate pressure and flow calculations in real time.

More particularly, FIG. 9 illustrates a flow diagram 900 depicting a method that implements an enhanced pressure and flow calculation technique within a simulation system, such as a distributed simulation system, while FIG. 10 illustrates an iterative process 1000 performed by the method of FIG. 9 at each of a set of simulation drops for one or more junction nodes of a process network. While the technique described in conjunction with FIGS. 9 and 10 is very useful in a distributed simulation system that uses a sequential solving technique, it can be used in other distributed or non-distributed simulation systems to provide quick and accurate determinations or estimates of pressures and flows in a complicated process network, such as one having junction nodes therein.

Figure 11A:
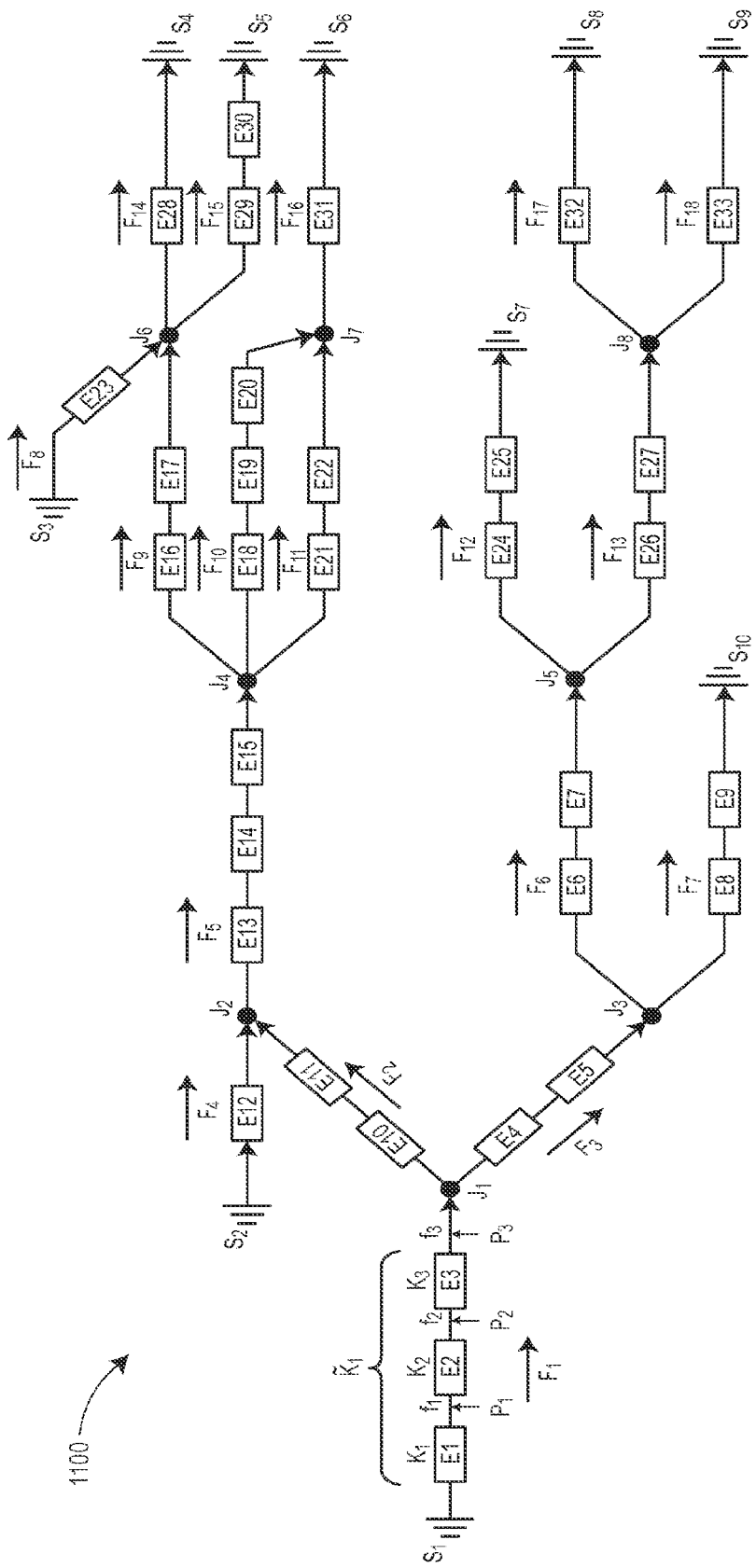
FIG. 11A illustrates an example process network having a set of interconnected process network nodes and flow paths to be simulated by a simulation system.
Figure 11B:
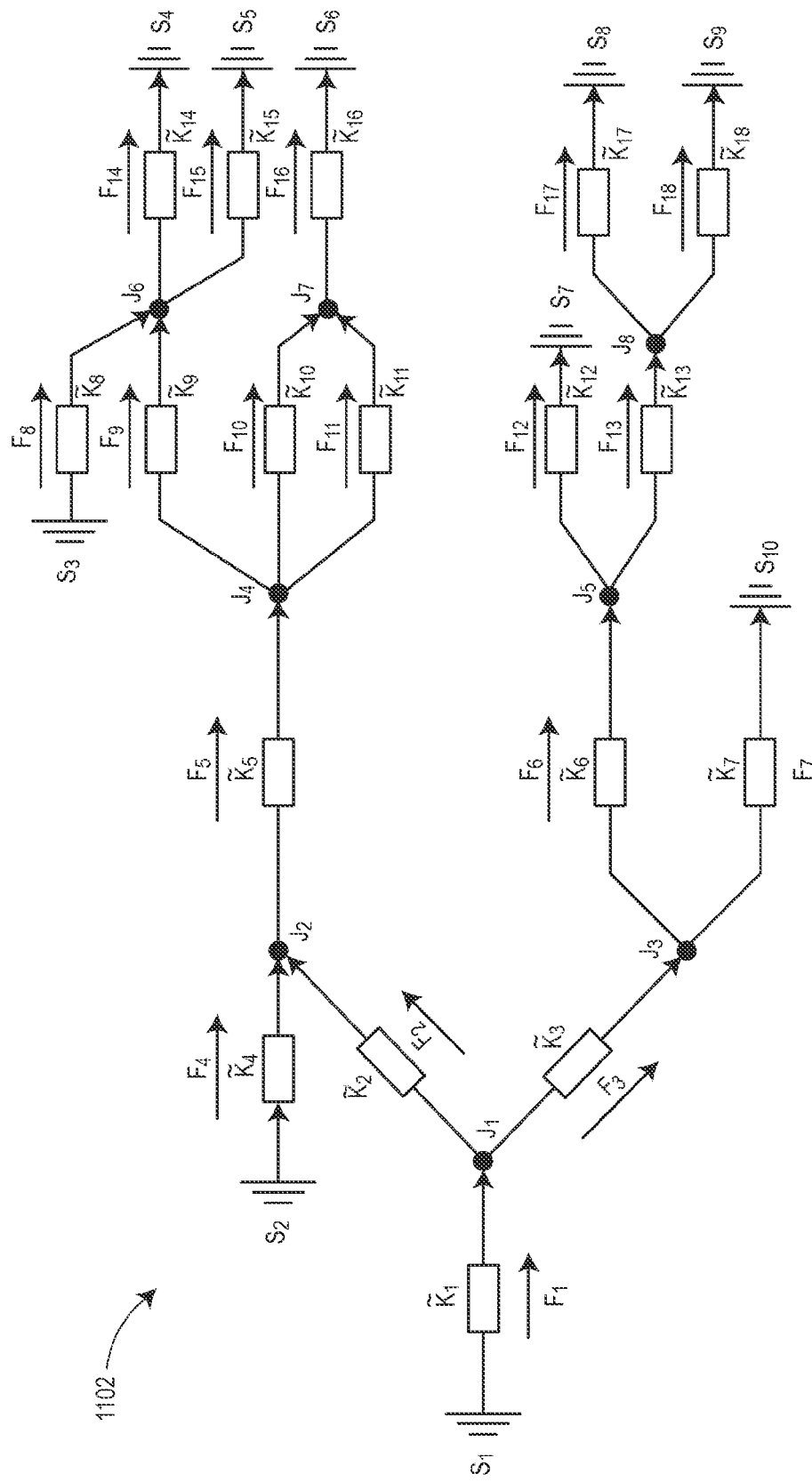
FIG. 11B illustrates a composite network diagram created for the process network of FIG. 11A, having various starting, stopping and junction nodes separated by composite process elements.

FIGS. 11A-11B, 12A-12C and 13 illustrate the operation of the pressure and flow calculation technique of FIGS. 9 and 10 within an example process network having a number of junction and non-junction nodes therein. In particular, FIG. 11A illustrates a fairly complicated process network or flow system 1100 having a number of process components or elements separated by nodes, some of which are junction nodes at which various fluid flows converge or diverge. In particular, the system 1100 of FIG. 11A includes a set of starting nodes $S_1$-$S_3$ at which flow originates and a set of stopping nodes $S_4$-$S_{10}$ at which flow ends in the process network 1100. Generally speaking, starting and stopping nodes are nodes in a process network at which pressures are fixed or only slightly changing and are typically known via, for example, design, feedback from an actual process network, established by set-points, etc. Thus, the input or output pressures at the starting and stopping nodes of a process network are generally known either by design or because they are established by user settable set-points, they are calculated elsewhere, etc.

In any event, the process network 1100 of FIG. 11A also includes a set of process elements (E1-E33) downstream of one or more of the starting nodes $S_1$-$S_3$ and upstream of one or more of the stopping nodes $S_4$-$S_{10}$, with the process elements E1-E33 being disposed along various flow paths $F_1$-$F_{18}$ that either converge or diverge at one or more junction nodes $J_1$-J8. In particular, the junction nodes $J_1$-$J_8$ are nodes in the process network 1100 at which flow converges or diverges. The process network 1100 includes other nodes in the form of nodes between the various process elements E1-E33 disposed along a flow path at which no junction node exists. Thus, a process node exists between the process elements E1 and E2, between the process elements E2 and E3, etc. of FIG. 11A. These non-junction nodes will be referred to herein as sub-nodes. Because flows converge or diverge at the junctions nodes $J_1$-$J_8$, the manner of determining the pressure at the junction nodes $J_1$-$J_8$ is more computationally complicated than that of determining pressures at the sub-nodes (i.e., the nodes between process elements along a particular flow path).

In any event, the process elements E1-E33 in this case can be any desired types of elements such as valves, pipes, etc. However, for the sake of illustration and brevity of description, the process elements E1-E33 of FIG. 11A will be assumed to be non-storage elements, i.e., elements that do not store mass. As a result, it can be assumed that the flows along any flow path disposed between any set of two adjacent starting or stopping nodes and junction nodes, or between any two adjacent junction nodes is relatively constant (i.e., the same) along the entire flow path. The set of flow paths $F_1$-$F_{18}$ along which flows travel between the various starting and stopping nodes $S_1$-$S_{10}$ and the junction nodes $J_1$-$J_8$ are illustrated in FIG. 11A.

As also illustrated in FIG. 11A, each of the process elements E1-E33 has a flow conductance K, and an individual flow and pressure associated with each of the process elements E1-E33 and can be determined for each of the process elements E1-E33. Thus, as illustrated in FIG. 11A, the process elements E1, E2, and E3 have flow conductances $K_1$, $K_2$, $K_3$, respectively, and the individual pressures and flows (i.e., the pressures and flows at the output of each sub-node in the flow path $F_1$) are illustrated in FIG. 11A using the labels P (for pressure) and f (for flow) between the process elements E1-E3. Thus, the flow at the output of the process element E1 sub-node is $f_1$ and the pressure at the output of the process element E1 sub-node is $P_1$. Here, it will be noted that the outlet pressure $P_3$ of the process element E3 sub-node is generally equal to the inlet pressure of the junction node $J_1$. While not illustrated in FIG. 11A, each process element E will have a flow conductance K and an individual pressure P and flow f will exist and can be determined at the output or input of each process element E.

As is known, the standard pressure-flow relationship for each process element or component E can be formulated as:

$$F = K\sqrt{\Delta P}$$

wherein $\Delta P$ is the differential pressure across the process element with a flow conductance K and F is the fluid flow through the process element.

Referring again to FIG. 9, the method 900 first identifies the junction nodes and process flow paths of the process network, and then creates a composite or simplified process network having junction nodes (and starting and stopping nodes) separated by a single combined or composite process element with a composite flow conductance. This step thus groups sub-nodes along a single flow path to combine various sub-nodes into a condensed set of nodes or process elements separated by junction nodes. Referring specifically to the flowchart 900 of FIG. 9, a block 902 determines a set of straight line flow paths $F_1$ to $F_n$ within the process network 1100 wherein each of the flow paths is a single flow path between two of the starting or stopping or junction nodes (e.g., between a starting node and a junction node, between two junction nodes, or between a junction node and a stopping node). Generally speaking, the flows $F_1$ to $F_n$ will be established as flows going through process elements that are non-storage type of elements (i.e., that do not store mass).

The determined flow paths $F_1$ to $F_{18}$ associated with the process network 1100 that would be determined by the block 902 are illustrated in FIG. 11A. In this example, the flow path $F_1$ is the flow path between the starting node $S_1$ and the junction node $J_1$ and includes process elements E1, E2, and E3. In a similar manner, a flow path $F_2$ is illustrated as being disposed between the junction nodes $J_1$ and $J_2$ and includes process elements E10 and E11; a flow path $F_3$ is illustrated as being disposed between the junction nodes $J_1$ and $J_3$ and includes process elements (or sub-nodes) E4 and E5; a flow path $F_4$ is illustrated as being disposed between the starting node $S_2$ and the junction node $J_2$ and includes a single process element E12; a flow path $F_5$ is illustrated as being disposed between the junction node $J_2$ and the junction node $J_4$ and includes the process elements E13, E14 and E15; a flow path $F_6$ is illustrated as being disposed between the junction node $J_3$ and the junction node $J_5$ and includes the process elements E6 and E7; and a flow path $F_7$ is illustrated as being disposed between the junction node $J_3$ and the stopping node $S_{10}$ and includes the process elements E8 and E9. Additional flow paths between other nodes and flows through other process elements are also indicated in FIG. 11A. While not illustrated in FIG. 11A, individual flows (f), pressures (P) and flow conductances (K) are associated with each of the sub-nodes defined by each of the process elements E4-E33.

Of course, the block 902 may determine the flow paths $F_1$ to $F_n$ automatically using any appropriate analysis routine, or the flow paths $F_1$ to $F_n$ may be determined beforehand by, for example, a process engineer or other user and may be stored in a memory available to the block 902. In this later case, the block 902 may determine the flow paths $F_1$ to $F_n$ by recovering the indications of these flow paths from the memory. Alternatively, the block 902 may determine the flow paths $F_1$ to $F_n$ directly from a user via a user interface, if so desired, or may determine these flow paths in any other desired manner Next, a block 904 of FIG. 9 determines a set of composite flow conductances $\tilde{K}_1$ to $\tilde{K}_n$ associated with the process network 1100. Generally, the block 904 determines a single composite flow conductance $\tilde{K}_i$ for each identified flow path $F_i$. As will be understood, each composite flow conductance $\tilde{K}$ (i.e., $\tilde{K}_i$ for the ith flow path $F_i$) is determined as a combination of the flow conductances K for the process elements E in that flow path. Thus, for example, the composite flow conductance $\tilde{K}_1$ for the first flow path $F_1$ of FIG. 11A is a combination of the flow conductances $K_1$, $K_2$ and $K_3$. In this case:

$$\tilde{K}_1 = \sqrt{1/(1/K_1^2 + 1/K_2^2 + 1/K_3^2)}$$

Using this strategy, all network components (pipes, valves, etc.) in a single flow path are grouped as one process element or component block having an equivalent flow conductance that is calculated accordingly. As noted above, and as illustrated in FIG. 11A, the process components E1, E2, and E3 of flow path $F_1$ can be combined as a single component with a composite conductance $\tilde{K}_1$. In this case, the pressure-flow relationship for the flow path $F_1$ becomes:

$$F_1 = \tilde{K}_1 \sqrt{P_{S1} - P_{J1}}$$

where $P_{S1}$ is the pressure at the starting node $S_1$ and $P_{J1}$ is the input pressure at the junction node $J_1$.

Of course, the block 904 determines similar composite flow conductances for each of the other flow paths $F_2$-$F_{18}$ in the system 1100 of FIG. 11A. An illustrative example of the process network 1100 simplified to have a set of flow paths $F_1$ to $F_{18}$ with starting, stopping and junction nodes separated by combined or grouped process elements each with a composite flow conductance is illustrated as the composite process network 1102 in FIG. 11B. Here, it will be noted that the process elements E1-E3 are combined into a single grouped element with a flow conductance $\tilde{K}_1$, the process elements E10 and E11 are combined or grouped into a combined element with a flow conductance $\tilde{K}_2$, the process elements E4 and E5 are combined or grouped into a combined element with a flow conductance $\tilde{K}_3$, the process elements E13, E14 and E15 are combined or grouped into a combined element with a flow conductance $\tilde{K}_5$, the process elements E6 and E7 are combined or grouped into a combined element with a flow conductance $\tilde{K}_6$, and the process elements E8 and E9 are combined or grouped into a combined element with a flow conductance $\tilde{K}_7$. Moreover, as there is only one process element in the flow path $F_4$, the process element E12 will have a grouped or combined flow conductance $\tilde{K}_4$ that is equivalent to or the same as the flow conductance value $K_{12}$. Of course, the other process elements are combined in the other flow paths of the system 1102 of FIG. 11B to illustrate the entire process network 1100 of FIG. 11A simplified to include a set of junction and starting and stopping nodes separated by grouped or composite process elements in each flow path. Thus, composite flow conductances $\tilde{K}_1$ to $\tilde{K}_{18}$ are illustrated for each of the other flow paths $F_1$ to $F_{18}$ in FIG. 11B.

As will be understood, the block 904 may determine the composite flow conductances $\tilde{K}_1$ to $\tilde{K}_n$ automatically using any appropriate analysis routine (which may include accessing a set of stored or known flow conductances $K_1$ to $K_{33}$ for the system 1100 of FIG. 11A stored in a memory or provided by a user), or the composite flow conductances $\tilde{K}_1$ to $\tilde{K}_{18}$ may be determined beforehand by, for example, a process engineer or other user and may be stored in a memory available to the block 904. In this later case, the block 904 may determine the composite flow conductances by recovering the indications of the composite flow conductances from the memory. Alternatively, the block 904 may determine the composite flow conductances directly from a user via a user interface, if so desired. In a still further case, the block 904 may determine the underlying flow conductances K for one or more of the process elements E from the simulation modules for these process elements. In particular, in some cases, such as with a valve, the position or state of the process element may affect or alter the flow conductance of that process element. Here, the process element models implemented by the simulation modules for those process elements may determine the flow conductances of those elements based on relevant or applicable process and equipment states or variables during each simulation cycle, and may provide these underlying flow conductances to the block 904 during each simulation cycle to thereby update the flow conductances for these process elements during run time of the simulation system. The block 904 may thereby need, in this case, to determine new composite flow conductance values $\tilde{K}$ for one or more flow paths F during each simulation cycle.

After the block 904 has determined the composite flow conductances $\tilde{K}$ for each of the flow paths F to develop a simplified or composite process network, a block 906 operates to determine one or more grouped sets of nodes within the composite process network 1102 to use when performing an iterative pressure determination technique for the junction nodes of the process network 1102. Generally, one grouped set of nodes is determined for each base junction node. In particular, the block 906 first selects a particular junction node (e.g., junction node $J_1$) as a base junction node, and then selects a subset of the nodes of the simplified process network 1102 to be used as a grouped set of nodes for that base junction node. This grouped set of nodes will later be used by a simulation drop that is associated with or responsible for simulating the base junction node to determine or to simulate the pressure at the base junction node. The block 906 will, in turn, select each of the other junction nodes (e.g., junction nodes $J_2$-$J_8$) in turn as the base junction node and will determine a grouped set of nodes for each of those nodes. Typically, each grouped set of nodes is a subset the junction and starting and stopping nodes of the network 1102 that is less than all of the nodes of the process network 1102.

More particularly, the block 906 picks a particular junction node within the process network 1102 to analyze as a base junction node and, for the base junction node, determines a set of nodes surrounding the base junction node (including nodes upstream and downstream of the base junction node) to use as the grouped set of nodes for the base junction node. The block 906 then selects a new or a different junction node as the base junction node and determines a set of nodes surrounding the newly selected base junction node as the grouped set of nodes for the newly selected base junction node. The block 906 may repeat this process for some, all or most of the junction nodes in the composite process network 1102 to determine a grouped set of nodes (which grouped set of nodes is typically less than all of the nodes of the simplified process network 1102) for each of the selected base junction nodes.

In one example, the block 906 may select a fixed number of junction nodes including the base junction node and junction nodes upstream and/or downstream of the base junction node to use as a core group of the grouped set of nodes for the base junction node. The block 906 may also include, in the grouped set of nodes for the base junction node, each and every other junction or starting or stopping node immediately upstream or downstream of any of the selected or core group of junction nodes. Thus, for example, the block 906 may store and use a fixed number of junction nodes to use in each grouped set of nodes for a base junction node and label or express each other starting node or stopping node or junction node either immediately upstream or downstream of any of the selected junction nodes as a boundary node in the grouped set of nodes. In this case, boundary nodes will be simulated as nodes at which the pressure is known, and is fixed or changing slowly so as to be able to be modeled as being fixed.

As an example of this grouping technique, it will be assumed that the block 906 uses a fixed number of three junction nodes to use in any particular grouped set of nodes for a particular base junction node when determining a grouped sets of nodes for the base junction using the composite process network 1102 of FIG. 11B. In this case, the block 906 may start by selecting the first junction node $J_1$ in the composite process network 1102 as the base junction node and may then determine a grouped set of nodes for the junction node $J_1$ being the base junction node. The block 906 will typically (usually always) place the base junction node (in this case the junction node $J_1$) into the grouped set of nodes for the base junction node $J_1$. Additionally, the block 906 will look for two other junction nodes to place within the grouped set of nodes for the junction node $J_1$ being the base junction node. While the block 906 may analyze the nodes upstream and downstream of the base junction node $J_1$ to find additional junction nodes to place into the grouped set of nodes being created, the block 906 will typically or preferably look at the nodes that are downstream from the base junction node $J_1$ first. In this case, the block 906 finds two junction nodes immediately downstream of the base junction node $J_1$, i.e., junction nodes $J_2$ and $J_3$, and places these nodes into the grouped set of nodes for the base junction node $J_1$. It should be noted that it is preferable, but not absolutely necessary, that all downstream junction nodes that are immediately adjacent to the selected junction node be placed in the grouped set of nodes for the selected junction node. However, it is also possible, and in some cases preferable, to have junction nodes that are separated from (i.e., not directly adjacent to) the base junction node placed into the grouped set of nodes for the base junction node. Of course, which junction nodes that are placed into the grouped set of nodes for a particular base junction node will depend on the process network topology and the ultimate number of junction nodes that are placed into the grouped set of nodes for each base junction node.

Following this example, assuming that the junction nodes $J_1$, $J_2$ and $J_3$ are selected as the set of junction nodes to be included in the grouped set of nodes for the base junction node $J_1$, then all of the nodes directly adjacent to these selected junction nodes (whether these further nodes are starting nodes, are stopping nodes or are junction nodes and whether these further nodes are upstream or downstream of the selected junction nodes) are placed into the grouped set of nodes for the base junction node as boundary nodes. FIG. 12A illustrates a subset of nodes 1201 of the composite process network 1102 defined by a grouped set of nodes determined for the junction node $J_1$ being the base junction node, and in the situation in which the block 906 selects three junction nodes for use in each grouped set of nodes. Here, the junction nodes $J_1$ to $J_3$ are placed in the grouped set of nodes for base junction node $J_1$ as the selected junction nodes and the nodes $S_1$, $S_2$, $S_{10}$, $J_4$ and $J_5$ are placed into the grouped set of nodes as boundary nodes (as each of these boundary nodes is immediately upstream or downstream of one of the selected junction nodes).

As will be seen in the grouped set of nodes 1201 in FIG. 12A, the starting node $S_1$ is labeled as a boundary node $B_{S1}$ (and is selected as being immediately upstream of junction node $J_1$), the starting node $S_2$ is labeled as a boundary node $B_{S2}$ (and is selected as being immediately upstream of junction node $J_2$) and the stopping node $S_{10}$ is labeled as boundary node $B_{S10}$ (and is selected as being immediately downstream of the junction node $J_3$). Likewise, the junction node $J_4$ is labeled as a boundary node $B_{J4}$ (and is selected as being immediately downstream of junction node $J_2$) while the junction node $J_5$ is labeled as a boundary node $B_{J5}$ (and is selected as being immediately downstream of the junction node $J_3$). Thus, each of the selected junction nodes $J_1$ to $J_3$ are placed into the grouped set of nodes for the base junction node $J_1$ and these nodes will be treated as junction nodes (at which pressures will be determined) when performing simulation calculations using this grouped set of nodes. On the other hand, each of the other nodes in FIG. 12A which are adjacent to one or more of the selected junction nodes are placed into the grouped set of nodes for the base junction node $J_1$ but are marked as boundary nodes, meaning that the pressure at these nodes will be assumed to be fixed or only slowly changing in further calculations using this grouped set of nodes.

Now, in a similar manner, the block 906 selects the junction node $J_2$ of the combined process network 1102 of FIG. 11B as the base junction node and determines a grouped set of nodes for junction node $J_2$ being the base node. In this case, in which the selected group of nodes is still being determined using a fixed number of (i.e., three) junction nodes, the block 906 will first select junction node $J_2$ as one of the three junction nodes, and may select the junction node $J_1$ as one of the three junction nodes and may select the junction node $J_4$ as the final one of the three junction nodes for the grouped set of nodes being created for the junction node $J_2$ as the base junction node. Now, all of the non-selected nodes upstream and downstream of the selected junction nodes are also placed into the selected group of nodes as boundary nodes for this grouped set of nodes. FIG. 12B illustrates the selected grouped set of nodes 1202 determined in this manner from the composite process network 1102 for junction node $J_2$ being the base junction node. Here, the starting node $S_1$ is labeled as a boundary node $B_{S1}$ (upstream of the junction node $J_1$), the starting node $S_2$ is labeled as the boundary node $B_{S2}$ (upstream of junction node $J_2$), the junction node $J_3$ is labeled as the boundary node $B_{J3}$ (downstream of the junction node $J_1$), the junction node $J_6$ is labeled as the boundary node $B_{J6}$ (downstream of the junction node $J_4$), and the junction node $J_7$ is labeled as the boundary node $B_p$ (downstream of the junction node $J_4$). The starting node $S_3$ is also placed into this set of nodes as a boundary node $B_{S3}$ for being upstream of one of the selected boundary nodes, i.e., the boundary node $B_{J6}$. All of these nodes are thus placed into the grouped set of nodes for junction node $J_2$ being the base junction node.

Of course, it will be understood that a different set of junction nodes could be selected as a set of junction nodes for junction node $J_2$ being the base node resulting in a different grouped set of nodes. For example, the block 906 could select junction nodes $J_2$, $J_4$ and $J_6$ as the selected junction nodes for grouped set of nodes for junction node $J_2$ being the base junction node. FIG. 12C illustrates the grouped set of nodes 1203 that would result from this selection. Here it will be seen that junction node $J_1$ is still in the selected group of nodes but is now a boundary node $B_{J1}$. It will also be seen that the nodes $S_3$, $S_4$ and $S_5$ are also in the grouped set of nodes as boundary nodes $B_{S3}$, $B_{S5}$ and $B_{S5}$, respectively. Note that, in either case, the grouped set of nodes created for the junction node $J_2$ being the base junction node is different than the grouped set of nodes created for the junction node $J_1$ being the base junction node, and that some of the junction nodes placed into the grouped set of nodes for the junction node $J_1$ as the base junction node are used in the grouped set of nodes for the junction node $J_2$ being the base junction node as boundary nodes (e.g., node $J_3$).

It will be understood that the selected junction nodes within each grouped set of nodes illustrated in FIGS. 12A-12C are indicated as a junction node with the indicator J (e.g., junction node $J_1$, $J_2$, etc.), while each of the other nodes within the selected group of nodes are indicated as boundary nodes with the indicator B. Thus, when the starting node $S_1$ is placed into the selected group of nodes as a boundary node, it is labeled as a boundary node $B_{S1}$. Likewise, while when a junction node such as the junction node $J_4$ is placed into the selected group of nodes as a boundary node, it is labeled as boundary node $B_{J4}$. This nomenclature is used throughout the drawings. Moreover, the pressures at the junction nodes are indicated with a P having a subscript of the original junction node indicator while the pressures at the boundary nodes are indicated with a P having a subscript of the boundary node name. Thus, the pressure at junction node $J_1$ (when the node $J_1$ is treated as a junction node) is labeled as $P_{J1}$ while the pressure at a boundary node $J_1$ (when the node $J_1$ is treated as a boundary node) is $P_{BJ1}$. Likewise, the pressure at a starting or a stopping node used as a boundary node is labeled with a P with a subscript of the boundary node. For example, the pressure at the starting node $S_1$ used as a boundary node $B_{S1}$ is $P_{BS1}$.

In any event, the block 906 may repeat the process of creating a grouped set of nodes for each of the other junction nodes of the composite process network 1102 of FIG. 11B. It will also be understood that block 906 may use any desired number to specify the number of junction nodes to be placed in each grouped set of nodes for a base node. While three junction nodes was used in this example for the sake of simplicity, other numbers such as six, ten, fifteen, etc. could be used instead. Moreover, this number may be a fixed or a predetermined number and may be selectable or changeable by a user, a process engineer, etc. if so desired. Alternatively, however, it is not required that each grouped set of nodes have the same number of junction nodes placed therein. For example, in some cases, the network topology may not allow the block 906 to find a predetermined number of junction nodes for the grouped set of nodes for a particular base junction node, and in these situations, less than the preselected number of junction nodes may be used. Alternatively, a different group selection scheme may be used in which the block 906 may determine that each junction node within a certain number of hops (or other measure of distance) away from the base junction node will be included in the grouped set of nodes for the base junction node, regardless of how many resultant junction nodes are found using this criterion. In this case, any node either upstream or downstream of one of the selected junction nodes will still be placed in the grouped set of nodes for the base junction node as boundary nodes. Moreover, the number of junction nodes to place into each grouped set of nodes may be selected or changed based on the available computing power of the simulation nodes or drops, the complexity of the process network, the sampling times, etc.

After the block 906 has determined a grouped set of nodes for each of the junction nodes of the process network 1100 or of the simplified process network 1102 being selected as a base junction node, these different grouped sets of nodes will be used by the various different simulation drops associated with the junction nodes to compute the pressure at the junction nodes. As will be described in more detail, a simulation drop for a base junction node will implement a set of equations that solves for the pressures at each of the junction nodes within the respective grouped set of nodes established for the base junction node (i.e., for the base junction node associated with that simulation drop) to thereby determine a nodal pressure at the base junction node.

More particularly, a block 908 of FIG. 9 can be implemented by each of the simulation drops responsible for simulating the operation of a junction node within the process network 1100 or 1102. Generally speaking, the block 908 uses one of the grouped set of nodes to determine the pressure at a base junction node for which the grouped set of nodes was determined. As will be understood, each simulation drop will use a different grouped set of nodes and thus will implement a different set of equations or algorithms for its associated junction node. Here, the specific equations being used at each simulation drop will be based on the grouped set of nodes determined for that junction node when that junction node was the base junction node.

However, the algorithms at each simulation drop may use variable values determined by other simulation drops for other junction nodes (e.g., adjacent junction nodes) as inputs. Because the simulation drops for the different junction nodes are operating separately (and simultaneously) during each simulation sampling period or simulation cycle, each simulation drop may use the values of the pressures developed by and received from other simulation drops for other nodes during the last sampling period in its calculations, and is able to obtain these values at the beginning or ending of each sampling time or simulation cycle using the communication techniques described above.

In the subsequent description provided herein, a base node will be used to refer to the junction node for which a pressure value is ultimately being determined by a simulation drop. That is, the base node is the junction node associated with the simulation drop and is the process network node for which the simulation drop is determining a pressure value to be used as an output of the simulation system. As will be seen, however, during the process of determining the pressure at a base node during a particular simulation cycle, the simulation drop for the base node will also calculate pressures at each of the other junction nodes within the grouped set of nodes for the base node while assuming that the pressure at the boundary nodes within the grouped set of nodes remains constant, fixed and known.

FIG. 10 illustrates a flow chart or a routine 1000 that may be used at each of the simulation drops during each simulation cycle or sampling time to determine a pressure at an associated base node, to thereby implement the step of block 908 of FIG. 9. As will be seen, the flow chart 1000 implements an iterative technique during each simulation cycle to determine the pressure at the base node associated with the simulation drop executing the routine 1000. At the start of a simulation cycle, a block 1010 first sets or resets a value of an iteration number variable to one. The iteration number variable is simply a variable that tracks the number of iterations that the algorithm or routine at the simulation drop has gone through during the current sampling time or simulation cycle.

Generally speaking, during each iteration of the algorithm 1000, the simulation drop for a base node will, in turn, calculate a new pressure value at each of the junction nodes of the grouped set of nodes for the base node. Then the algorithm 1000 will repeat this process in a new iteration using the pressure values developed from the last iteration to thereby iterate to a set of pressure values for the junction nodes in the grouped set of nodes that results, as best as can be determined, in flow balance being met at each of the nodes in the grouped set of nodes.

To start this process, a block 1012 selects the next junction node in the grouped set of nodes for the base node being simulated. The block 1012 may select the base node as the current junction node first and then may sequentially rotate through the junction nodes of the grouped set of nodes for the base node in turn during a particular iteration. In the time after the last junction node has been set to be the current junction node, the block 1012 may return to the base node as being the current junction node to start a new iteration.

In any event, a block 1014 next calculates the flows into and out of the current junction node based on the current values of the pressures at each of the nodes adjacent to the current junction node. More particularly, the block 1014 may determine the flows into and out of the current junction node using the general expression:

$$F_i = \tilde{K}_i \sqrt{\Delta P}$$

Wherein: $F_i$ is the flow through a flow path coming into or out of the current junction node,
$\tilde{K}_i$ is the composite flow conductance across the flow path, and
$\Delta P$ is the pressure drop across the flow path.

For example, in the situation in which the junction node $J_1$ of FIG. 11B is the base node for which a simulation drop is determining pressure and the grouped set of nodes for the node $J_1$ being the base node is the grouped set of nodes illustrated in FIG. 12A, then the flows into and out of the junction node $J_1$ can be established as:

$$F_1 = \tilde{K}_1 \sqrt{P_{BS1} - P_{J1}}$$

$$F_2 = \tilde{K}_2 \sqrt{P_{J1} - P_{J2}}$$

$$F_3 = \tilde{K}_3 \sqrt{P_{J1} - P_{J3}}$$

Wherein: $P_{BS1}$ is the nodal pressure at the boundary node $B_{S1}$;
$P_{J1}$ is the nodal pressure at the junction node $J_1$;
$P_{J2}$ is the nodal pressure at the junction node $J_2$; and
$P_{J3}$ is the nodal pressure at the junction node $J_3$.

Here, the values of $P_{J1}$, $P_{J2}$, $P_{J3}$ may be the most recently calculated values of these pressures, which may be the values of these pressures determined during the last iteration of the algorithm 1000 during the current sampling cycle at the simulation drop performing these calculations or the values of these pressures determined during the last sampling period or simulation cycle either at the current simulation drop or at a simulation drop associated with the actual junction nodes. Likewise, the value of $P_{BS1}$ is assumed to be known and fixed (because it is a boundary node pressure) and may be fixed at the value determined for that node in the last simulation cycle by the simulation drop associated with the $S_1$ node. Here, because the $S_1$ node is a starting node of the entire process network, the pressure at this node is assumed to be known. However, if a boundary node in any of the calculations is actually a junction node in the process network, the value of the pressure at this node may be assumed to be fixed at the value most recently calculated by the simulation node for that junction node, i.e., the value determined during the last simulation cycle.

Upon determining the flows into and out of the current junction node, the block 1014 determines a summation of these flows to determine if the calculated flows are balanced within the current junction node. More particularly, for all junction nodes (either three-way flow junctions, or a multi-point flow junctions), the flow balance summation can be determined as:

$$\Sigma_{i=1}^n F_i$$

Where the $F_i$ variables are the individual flows coming into and going out of the current junction node and n is the total number of flows into or out of the current junction node.

Upon determining the flow balance summation, a block 1016 determines if the flow balance summation is zero or has a magnitude that is less than a threshold (as this calculation will rarely determine an exact zero balance in practical applications). The threshold may be user selectable or may otherwise be preset at any desired level of accuracy.

If the flow summation for a node is not zero (or is larger than a preset or determined tolerance threshold), then the algorithm 1000 will generally determine or calculate a new pressure value for the current junction node using the most recently calculated values (e.g., pressure values) at each of the nodes adjacent to the current node. In particular, a block 1018 may calculate a new nodal pressure at the current junction node by setting the flows into and out of the current junction node so that they balance. More particularly, for all junction nodes (either three-way flow junctions, or a multi-point flow junctions), the nodal pressure of the current junction node can be calculated by locally solving a mass balance equation:

$$\Sigma_{i=1}^n F_i = 0$$

Where the $F_i$ variables are the flows coming into and going out of the current junction node (i.e., the node at which the nodal pressure is being determined) and using the pressure equations:

$$F_i = \tilde{K}_i \sqrt{\Delta P_{Fi}} \text{ for } i=1 \text{ to } n$$

wherein $\Delta P_{Fi}$ is the pressure differential across the flow path $F_i$.

FIG. 13 illustrates the manner in which these pressure equations would be constructed for each of the junction nodes $J_1$, $J_2$ and $J_3$ when using the grouped set of nodes of FIG. 11A in which the junction node $J_1$ is the base junction node. In particular, equations are formed for each of the junction nodes using the variable values (e.g., pressure variables, composite conductance variables and flow variables) associated with each of a set of adjacent boundary nodes or junction nodes of the current junction node within the grouped set of nodes, i.e., the boundary or junction nodes of the grouped set of nodes that are immediately upstream and downstream of the current junction node for which the pressure is being determined. Generally, the pressure equation for each junction node uses variable values only from the immediate upstream and downstream boundary or junction nodes along the flow paths coming into or going out of the current junction node. FIG. 13 illustrates the different local sections of the process network 1201 that are used to perform a pressure calculation when each of the different junction nodes $J_1$, $J_2$ and $J_3$ are set to be the current node within the grouped set of nodes illustrated in FIG. 12A (in which the junction node $J_1$ is the base junction node). In particular, in this illustrative example, the components within the dashed line will be solved or used by the block 1018 when the junction node $J_1$ is the current node to obtain the junction node pressure $P_{J1}$, the components within the solid thin line will be solved or used by the block 1018 when the junction node $J_2$ is the current node to obtain the junction node pressure $P_{J2}$, and the components within the solid thick line will be solved or used by the block 1018 when the junction node $J_3$ is the current node to obtain the junction node pressure $P_n$.

In this example, when the junction node $J_1$ is the current node, the block 1018 sets $F_1+F_2+F_3=0$. If the junction is a three-way splitter junction, then the pressure can be solved analytically using the technique described above with respect to FIG. 5, which means that the iterative procedure described below is not required. If, more generally, the junction node is a multi-point junction such as those shown in FIGS. 11A, 11B and 12A, then the iterative method described herein can be implemented to numerically solve the nodal pressure at the base junction node. Importantly, in these calculations, the pressures at the adjacent (upstream and downstream) junction and boundary nodes will be set to be fixed at their most recently calculated or determined value (e.g., the values of the pressures determined in the last iteration or the last simulation time sampling value for junction nodes and to the fixed values for boundary nodes).

Thus, for the example in which junction node $J_1$ is the current junction node and using the grouped set of nodes illustrated in FIG. 12A, the following equations can be used to solve for the flows $F_1$ to $F_3$:

$$F_1 = \tilde{K}_1 \sqrt{P_{BS1} - P_{J1}}$$

$$F_2 = \tilde{K}_2 \sqrt{P_{J1} - P_{J2}}$$

$$F_3 = \tilde{K}_3 \sqrt{P_{J1} - P_{J3}}$$

and $$F_1 + F_2 + F_3 = 0.$$

Here it will be understood that all pressure variable values other than the nodal pressure variable $P_{J1}$ are set (assumed for the purpose of this calculation) to be the last calculated value for these pressures either in this iteration or a previous iteration or in the last sampling time. However, it is not strictly necessary to set the junction nodal pressures to any particular value to start of a set of iterations, because the technique will iterate to the correct values over time during a simulation cycle based on the fixed boundary nodal pressures.

After solving for the pressure at the current node, a block 1020 may clear a balanced node flag (described in more detail below) for each of the junction nodes within the grouped set of nodes to indicate that the flows at each junction node within the grouped set of nodes are not necessarily balanced. This action generally indicates that further iterations may be required to reach a steady-state condition at which flows are balanced at each of the junction nodes within a grouped set of nodes.

If, on the other hand, the flows at the current node are determined to be balanced within an acceptable tolerance level at the block 1016, a block 1022 may set a balanced node flag for the current node to indicate that the flows at this node are balanced based on the most recently calculated set of pressures at the current node and the nodes that are adjacent to the current node.

A block 1024 may then determine if balanced node flag is set for all of the junction nodes within the grouped set of nodes being used by the simulation block, meaning that the block 1016 has determined that all of the pressures as currently calculated for the junction nodes of the grouped set of nodes during the current simulation cycle resulted in a balanced flow at each of these junction nodes. This situation arises when the pressure at the base junction node is correct or has iterated to a steady-state value. If the block 1024 determines that such a steady-state condition exists, the algorithm 1000 is complete and halts until the next simulation cycle, and control is returned back to the overall algorithm depicted in FIG. 9 to complete a simulation cycle.

On the other hand, when the block 1024 determines that the balanced node flag is not set for each of the junction nodes within the grouped set of nodes, or after operation of the block 1020, a block 1026 determines if the iteration variable value is greater than a maximum number of iterations. The maximum number of iterations may be set by a user, a process engineer or otherwise to specify the maximum number of iterations the routine 1000 will go through to determine the nodal pressure at the base junction node. The number of iterations may be limited to assure that the routine 1000 is able to determine a nodal pressure value in real time (i.e., in less than the time associated with the simulation cycle period).

If the current iteration number is not greater than the maximum number of allowed iterations, then a block 1028 determines if the current junction node is the last or final junction node in the set of junction nodes within the grouped set of nodes for the base node. If not, meaning that the routine 1000 has not analyzed all of the junction nodes in the grouped set of nodes in the current iteration, control is returned to the block 1012 which then selects the next junction node to analyze in the current iteration. On the other hand, if the current junction node is determined to be the final junction node in the grouped set of nodes at the block 1028, then a block 1030 increments the iteration variable value by one (meaning that a new iteration will begin) and control is returned to the block 1012 which sets the first junction node within the grouped set of nodes as the current junction node, thereby beginning a new iteration.

As will be understood, the routine 1000 thereby operates to perform a number of iterations in which the routine 1000 calculates a new nodal pressure at each of the junction nodes within the grouped set of nodes for a base junction node and checks the flow balances at the nodes based on these newly calculated nodal pressures. This iterative process is performed (using the most recently calculated nodal pressures in each subsequent nodal pressure calculation) until a set of nodal pressures are determined that results in balanced flow at one or more of the junction nodes, or until a maximum number of iterations has been performed.

In the case in which the maximum number of iterations is performed without reaching a balanced flow condition at the base junction node or at each of the junction nodes of the grouped set of nodes (as would be determined by the block 1026 determining that the current iteration number is greater than the maximum iteration value), then a block 1032 may perform a nodal pressure calibration step that assists the algorithm 1000 in the next sampling cycle to reach a balanced flow condition.

In particular, the block 1032 may indirectly modify the originally calculated nodal pressure for a junction node (e.g., for the base junction node of the grouped set of nodes) by, for example, adjusting the inlet flow conductance K, for that junction node to be used by the block 1018 to perform nodal pressure calculations during the next simulation cycle or sampling time. A generic form of an equation that may be used to adjust the inlet flow conductance of a junction node is:

$$\tilde{K}_{i-com} = k \cdot \frac{\sum_{i=1}^{n} f_{out\_i}}{\sum_{j=1}^{m} f_{in\_j}} \cdot \tilde{K}_i$$

Here, $\tilde{K}_{i-com}$ is compensated inlet flow conductance for the ith flow $F_i$ that is the inlet flow to the unbalanced junction node; $\tilde{K}_i$ is the original flow conductance for the ith flow $F_i$ that is the inlet flow to the unbalanced junction node (and can be the composite flow conductance determined by the block 904 of FIG. 9 if desired); and k is a tuning constant set to determine the aggressiveness of this calibration. In this equation, the numerator represents total output flows from the unbalanced junction node, and the denominator represents total input flows to the unbalanced junction node. Importantly, this compensated flow conductance is used in the next sampling time in the block 1018 to iterate to a new nodal pressure at the unbalanced node. However, this compensated flow conductance is not used in the block 1014 to determine flows or the flow balance at a junction node in the first place. Instead, the block 1014 will use the uncompensated or original flow conductance of the process network as modeled. The use of this compensated flow conductance (which is always calculated based on the original flow conductance of the flow path), enables the routine 1000 to find a steady state nodal pressure more quickly in the next simulation cycle or sampling period.

In any event, after determining a compensated flow conductance value for one or more of the junction nodes within the grouped set of nodes (and in particular for the base junction node in the grouped set of nodes), the block 1032 stores these compensated flow conductances in a memory for use by the block 1018 in the next simulation cycle and returns control back the routine 900 of FIG. 9.

Referring again to FIG. 9, after operation of the block 908 at each of the appropriate simulation drops, a block 918 uses the nodal pressures determined by the various simulation drops for the junction nodes of the process network 1100 to determine the actual flows in each of the flow paths (i.e., the straight paths between any two nodes). It will be understood that the only pressure values used in this and subsequent steps of FIG. 9 are the base nodal pressures determined by the simulation drop associated with the base node. Thus, the simulation drop associated with the junction node $J_1$ develops and sends the determined junction nodal pressure $P_{J1}$ (which is the pressure at the base node $J_1$ for this simulation drop) to other simulation drops for use at those simulation drops, but this simulation drop does not necessarily communicate the junction nodal pressures $P_{J2}$ or $P_{J3}$ as calculated by this simulation drop. Instead, the nodal pressures $P_{J2}$ and $P_{J3}$ are determined by simulation drops for junction nodes $J_2$ and $J_3$, respectively, each of which uses a different grouped set of nodes to determine these pressures.

In any event, after all of the junction nodal pressures are determined, the flows in the straight paths between the junction nodes or between starting and stopping nodes and junction nodes can be calculated (as these flows are all equal in any particular flow path). Thereafter, a block 920 determines the pressure of each process element or process component based on adjacent component pressures and the main flow in the flow path through that process element.

For example, the fluid flow within the flow path $F_1$ (the flow through process elements E1, E2 and E3 of FIG. 11A) can be calculated as:

$$F_1 = \tilde{K}_1 \sqrt{P_{S1} - P_{J1}}$$

Thereafter, the pressures at the output of the process elements E1 and E2 can be calculated as:

$$P_1 = P_{S1} - \frac{F_1^2}{K_1^2}$$

$$P_2 = P_1 - \frac{F_1^2}{K_2^2}$$

As will be understood, simulation modules responsible for these sub-nodes (which can be in the same or different simulation drops as simulation modules for junction nodes, if desired) perform these calculations based on the nodal pressure values determined by the simulation drops for the junction nodes. Of course, pressures and flows at each of the process elements E1-E33 of FIG. 11A can be determined in this same manner Next, a block 922 performs flow reconciliation between the various components in each of the flow paths. This flow reconciliation may be that described above with respect to FIGS. 7 and 8, in which a transient mass storage relay (TMSR) approach can be utilized, i.e., in which the imbalanced mass flow becomes temporary inventory at each simulation node and is relayed to a neighboring storage device (for example, a tank) simulation module for processing. Thereafter, at a block 925, operation of the block 908-922 repeats for the next sampling cycle or simulation sampling time. It will be noted that the blocks 902, 904 and 906 may be performed once and only re-executed when changes to the process network are made. However, if desired, these blocks, such as the block 904, could be re-executed during each sampling time or simulation cycle to, for example, account for changes in flow conductance values of process elements, or other changes within the process network that occur during process simulation.

It should be noted that the simplified process pressure-flow network of FIGS. 12 and 13 are illustrated using mostly three-way flow junctions. However, other multi-input and multi-output types of junctions can also be handled in a straightforward manner. Moreover, the process components between the boundary and the junction nodes are illustrated as being piping components without mass storage (e.g., pipes, ducts, valves, etc.) Each piping component also has its flow conductance (determined by its physical characteristics). Moreover, for the sake of brevity this description only deals with a process network having process or equipment components that either do not accumulate mass flow, or that have a mass inventory that is small and negligible in the simulation.

It will be understood that the steps or blocks of FIG. 9 may be individually and separately performed by different simulation drops within a distributed simulation system such as that described above with respect to, for example, FIG. 3. As one example, different simulation drops (processors or devices) associated with or responsible for the junction nodes of the simulation system may perform the iterative nodal pressure calculations and pressure calibrations independently for a grouped simulation system and may, at the end of each sampling period, provide the determined pressures at the sub-nodes grouped together in a flow path so that the simulation modules at these sub-nodes may then determine pressures and flows at those nodes. Alternatively, the entire simulation system may be configured as a grouped simulation system and may have simulation nodes associated with the junction nodes and the determined grouped sub-nodes. In this case, the simulation modules for the grouped sub-nodes may determine the pressures and flows for each of the sub-nodes associated with individual process elements. Moreover, as compared to the system described for FIG. 3, the simulation system that implements the technique of FIGS. 9 and 10 may communicate nodal pressure values between simulation modules for junction nodes once per sampling time or simulation cycle to allow the junction nodal pressures to be iteratively determined at each junction node based on new or updated values calculated for the adjunct junction nodes during each sampling time or simulation cycle. Still further, strictly speaking, the simulation modules for each junction node may communicate with the simulation modules for both adjacent and non-adjacent junction nodes to perform pressure calculations (e.g., the iterative pressure calculations) described with respect to FIGS. 9 and 10. As a result, the simulation modules for the junction nodes may communicate with nodes or drops in the simulation system that are not directly adjacent to the simulation drop for the junction node being simulated, as the junction nodes in each grouped set of nodes may be separated by grouped nodes or actual sub-nodes and in some cases, non-adjacent junction nodes are used in the grouped sets of node. As such, simulation drops for junction nodes may need to subscribe to and receive information from more than just the directly adjacent simulation nodes when implementing the technique of FIGS. 9 and 10. However, this fact typically will not add greatly to the overall communication load of the simulation system.

As will be understood, as compared to other real-time pressure-flow network solving methods, the approach described herein does not require absolute flow equivalence to be determined or reached at each sampling time. Therefore, the real-time iterative calculation time associated with the system described herein can be significantly reduced within each simulation cycle or sampling time, making this technique particularly suitable for use with distributed simulation methods or other simulators that implement a sequential solving method. Moreover, flow equivalence can be quickly obtained by iterations using each of the grouped set of nodes and the nodal pressure calibration step described above. Still further, overall mass balance is guaranteed by the transient mass storage relay method used during each sampling interval. Alternatively, however, the system may linearize all pressure-flow relationships first, and then solve for pressure at each nodal point. Moreover, while this simulation technique is described for use in the simulation of a distributed process network system, it can be used in other types of simulations as well, including for example, electrical network simulations, communication network simulations, transportation/traffic network simulations, etc.

When implemented, any of the simulation software and distributed simulation modules described herein may be stored in any computer readable memory such as on a magnetic disk, a laser disk, or other storage medium, in a RAM or ROM of a computer or processor, etc. and are executable on a computer processor. Likewise, this software or these modules may be delivered to a user, a process plant or an operator workstation using any known or desired delivery method including, for example, on a computer readable disk or other transportable computer storage mechanism or over a communication channel such as a telephone line, the Internet, the World Wide Web, any other local area network or wide area network, etc. (which delivery is viewed as being the same as or interchangeable with providing such software via a transportable storage medium). Furthermore, this software may be provided directly without modulation or encryption or may be modulated and/or encrypted using any suitable modulation carrier wave and/or encryption technique before being transmitted over a communication channel.

While the present invention has been described with reference to specific examples, which are intended to be illustrative only and not to be limiting of the invention, it will be apparent to those of ordinary skill in the art that changes, additions or deletions may be made to the disclosed embodiments without departing from the spirit and scope of the invention.

The invention claimed is:

1. A distributed simulation system for simulating the operation of a process network having a set of physical plant elements through which mass flows, comprising:

a computer network including a plurality of drops and a communication network that communicatively couples the plurality of drops, wherein each of the plurality of drops includes a processor; and a multiplicity of processor implemented simulation modules, each of the multiplicity of simulation modules including a process model that models the operation of a different one of the physical plant elements, wherein a first one of the simulation modules and a second one of the simulation modules are located in different ones of the plurality of drops;

wherein a plurality of the simulation modules are junction node simulation modules that model the operation of a set of different junction nodes within the process network at which flow within the process network converges or diverges, the set of different junction nodes including a plurality of nodes identified as base junction nodes, each of the junction node simulation modules including:

a memory that stores a definition of a grouped set of nodes associated with a base junction node, the base junction node being one of the plurality of nodes identified as base junction nodes in the set of different junction nodes within the process network, the grouped set of nodes for the base junction node being less than all of the nodes of the process network and including the base junction node, one or more further junction nodes that are adjacent to the base junction node, and one or more boundary nodes that are adjacent to at least one of the one or more further junction nodes but not adjacent to the base junction node; and a routine that executes on a processor to iteratively solve for the pressure at the base junction node during each of a number of simulation cycles using a set of pressure and flow equations based on the grouped set of nodes for the base junction node, to calculate the pressure at the base junction node; and wherein each of the junction node simulation modules is executed during each simulation cycle.

2. The simulation system of claim 1, wherein the first one of the simulation modules models the operation of a first one of the set of physical plant elements and the second one of the simulation modules models the operation of a second one of the set of physical plant elements disposed downstream of the first one of the set of physical plant elements, wherein the process model of the first simulation module uses a value of a pressure variable calculated by the second simulation module to produce an output associated with the operation of the physical plant element modeled by the first simulation module, and wherein the first and second simulation modules communicate calculated pressure variable information between one another to perform simulation of mass flow between the first physical plant element and the second physical plant element.

3. The simulation system of claim 1, wherein the routine iteratively solves for the pressure at the base junction node during each of a number of simulation cycles by performing a multiplicity of iterations during each of the number of simulation cycles, wherein each iteration includes sequentially solving for the pressure at each of the base junction node and the one or more further junction nodes of the grouped set of nodes for the base junction node using a previously calculated value for the pressures at the others of the base junction node and the one or more further junction nodes in the grouped set of nodes for the base junction node, and determining a mass flow balance in one or more of the base junction node and the one or more further junction nodes using the calculated pressures to determine if flow balance is achieved at the one of the base junction node or the one or more further junction nodes.

4. The simulation system of claim 3, wherein the routine performs the multiplicity of iterations for the base junction node by continuing to perform a new iteration during a particular simulation cycle if flow balance is not achieved at the one of the base junction node or the one or more further junction nodes during a current iteration of the particular simulation cycle.

5. The simulation system of claim 3, wherein the routine performs a multiplicity of iterations for the base junction node during a particular simulation cycle by halting the performance of a new iteration if flow balance is achieved at the one of the base junction node or the one or more further junction nodes or if a predetermined number of iterations has been performed during the particular simulation cycle.

6. The simulation system of claim 1, wherein the routine iteratively solves for the pressure at each of the base junction node and the one or more further junction nodes of the grouped set of nodes for the base junction node during a simulation cycle by setting the pressures at one or more of the boundary nodes of the grouped set of nodes for the base junction node to fixed values.

7. The simulation system of claim 6, wherein the routine sets the pressures at each of the boundary nodes of the grouped set of nodes for the base junction node to fixed values by determining the fixed values as values calculated by a simulation module associated with the one or more boundary nodes in a previous simulation cycle.

8. The simulation system of claim 1, wherein each of the memories for the simulation modules stores a grouped set of nodes for a simulation module that includes all nodes immediately upstream or downstream of each of the base junction node and the one or more further junction nodes of the grouped set of nodes as the boundary nodes for the grouped set of nodes.

9. The simulation system of claim 1, wherein the routine for one of the plurality of simulation modules performs a pressure calibration technique for a base junction node during a first simulation cycle to develop a calibrated variable value for use by the one of the plurality of simulation modules in the next simulation cycle for the base junction node to calculate the pressure at the base junction node.

10. The simulation system of claim 9, wherein the routine performs the pressure calibration technique for the base junction node by determining a calibrated flow conductance within an input flow path for the base junction node.

11. The simulation system of claim 9, wherein the routine performs the pressure calibration technique when a maximum number of iterations has been performed at the simulation module during a simulation cycle without reaching a flow balance for the base junction node.

12. The simulation system of claim 1, further including a composite network routine that determines the grouped set of nodes for each base junction node by determining a condensed process network having multiple process elements in a single flow path of the process network combined into a composite process element and using the condensed process network to determine the grouped set of nodes for each base junction node.

13. The simulation system of claim 1, wherein the routine solves for the pressure at each of the base junction node and the one or more further junction nodes in two or more iterations to determine a new pressure at each of the base junction node and the one or more further junction nodes using previously determined values for the pressure at each of the other of the base junction node and the one or more further junction nodes during each of the iterations and using fixed pressure values at each of the boundary nodes of the grouped set of nodes during each of the iterations.

14. The simulation system of claim 1, wherein the plurality of junction node simulation modules are disposed in the same drop.

15. A distributed simulation system for simulating the operation of a process network having a set of physical plant elements through which mass flows, comprising:

a computer network including a plurality of drops and a communication network that communicatively couples the plurality of drops, wherein each of the plurality of drops includes a processor; and a multiplicity of processor implemented simulation modules, each of the multiplicity of simulation modules including a process model that models the operation of a different one of the physical plant elements, wherein a first one of the simulation modules and a second one of the simulation modules are located in different ones of the plurality of drops;

wherein a plurality of the simulation modules are junction node simulation modules that model the operation of different junction nodes within the process network at which flow within the process network converges or diverges, each of the junction node simulation modules including:

a memory that stores a definition of a grouped set of nodes associated with a base junction node, the base junction node being one of the junction nodes within the process network, the grouped set of nodes for the base junction node being less than all of the nodes of the process network and including the base junction node and one or more further junction nodes and one or more boundary nodes, the boundary nodes being nodes within the process network that are adjacent to the base junction node or one of the one or more further junction nodes;

a routine that executes on a processor to iteratively solve for the pressure at the base junction node during each of a number of simulation cycles using a set of pressure and flow equations based on the grouped set of nodes for the base junction node, to calculate the pressure at the base junction node; and wherein each of the memories for the simulation modules stores a grouped set of nodes for a simulation module that includes a fixed number of junction nodes that is the same for each of the grouped set of nodes.

16. The simulation system of claim 15, wherein each of the memories for the simulation modules stores a grouped set of nodes for a simulation module that includes a number of junction nodes placed in the grouped set of nodes based on the distance of a junction node within the process network from the base junction node.

17. A method of simulating the operation of a process network having a set of physical plant elements through which mass flows including a plurality of junction nodes at which mass flow within the process network converges or diverges, the plurality of junction nodes including a plurality of nodes identified as base junction nodes, the method comprising:

using a computer device to determine a grouped set of nodes for each of the plurality of nodes identified as base junction nodes in the plurality of junction nodes within the process network, wherein a particular grouped set of nodes for a particular base junction node among the plurality of nodes identified as base junction nodes includes a set of selected junction nodes including the particular base junction node, one or more further junction nodes other than the particular base junction node that are adjacent to the particular base junction node, and a set of boundary nodes that are adjacent to at least one of the one or more further junction nodes but not adjacent to the particular base junction node, and wherein the set of selected junction nodes for the particular grouped set of nodes for the particular base junction node includes less than all of the junction nodes within the process network;

using one or more computer devices to iteratively solve for the pressure at each of the plurality of nodes identified as base junction nodes during each of a number of simulation cycles using a set of equations based on the grouped set of nodes determined for each of the plurality of nodes identified as base junction nodes to calculate the pressures at each of the plurality of nodes identified as base junction nodes; and using one or more computer devices to determine flows in the process network based on the pressure values determined for each of the plurality of nodes identified as base junction nodes during each simulation cycle.

18. The method of claim 17, wherein iteratively solving for the pressure at each of the plurality of nodes identified as base junction nodes during a simulation cycle includes, for a particular base junction node among the plurality of nodes identified as base junction nodes, performing a multiplicity of iterations, wherein each iteration includes sequentially solving for the pressure at each of the set of selected junction nodes of the grouped set of nodes for the particular base junction node using a previously calculated value for the pressures at the others of the set of selected junction nodes in the grouped set of nodes for the particular base junction node, and determining a mass flow balance in one or more of the set of selected junction nodes using the calculated pressures to determine if flow balance is achieved at the one or more of the set of selected junction nodes.

19. The method of claim 18, wherein performing a multiplicity of iterations for the particular base junction node includes continuing to perform a new iteration if flow balance is not achieved at the one or more of the set of selected junction nodes.

20. The method of claim 18, wherein performing a multiplicity of iterations for the particular base junction node includes halting the performance of a new iteration if flow balance is achieved at the one or more of the set of selected junction nodes or if a predetermined number of iterations has been performed during the simulation cycle.

21. The method of claim 18, wherein iteratively solving for the pressure for each of the base junction nodes during a simulation cycle includes, for a particular base junction node, setting the pressures at each of the boundary nodes of the grouped set of nodes for the particular base junction node to fixed values that remain the same during each iteration of the simulation cycle.

22. The method of claim 21, wherein setting the pressures at each of the boundary nodes of the grouped set of nodes for the particular base junction node to fixed values includes determining the fixed values as values calculated for the boundary nodes in a previous simulation cycle.

23. The method of claim 17, wherein determining a grouped set of nodes for each of the plurality of nodes identified as base junction nodes in the plurality of junction nodes within the process network includes selecting all nodes immediately upstream or downstream of each of the set of selected junction nodes of a particular grouped set of nodes as the boundary nodes for the particular grouped set of nodes.

24. The method of claim 17, further including performing a pressure calibration technique for a particular base junction node during a first simulation cycle to develop a calibrated variable value for use in the next simulation cycle for the particular base junction nodes to calculate the pressure at the particular base junction node.

25. The method of claim 24, further including performing the pressure calibration technique for the particular base junction node by determining a calibrated flow conductance within an input flow path of the particular base junction node.

26. The method of claim 24, including performing the pressure calibration technique when a maximum number of iterations has been reached during a simulation cycle without reaching a flow balance at the particular base junction node.

27. The method of claim 24, including performing the pressure calibration technique when a flow balance summation at the particular base junction node is greater than a threshold value after iteratively solving for the pressure at the particular base junction node.

28. The method of claim 17, further including determining a condensed process network having multiple process elements in a single flow path of the process network combined into a composite process element and wherein using a computer device to determine a grouped set of nodes for each of the plurality of nodes identified as base junction nodes in the plurality of junction nodes within the process network uses nodes defined by the condensed process network to determine a grouped set of nodes for each of the plurality of nodes identified as base junction nodes in the plurality of junction nodes.

29. The method of claim 28, further including determining a composite flow conductance for the composite process element based on a set of flow conductance values for each of the multiple process elements within the flow path.

30. The method of claim 17, further including using a set of separately executable simulation modules to perform a simulation for different ones of the plurality of nodes identified as base junction nodes in the plurality of junction nodes, wherein each of the set of simulation modules executes using a different one of the grouped sets of nodes.

31. The method of claim 17, wherein two or more of the grouped sets of nodes includes a different group of nodes of the process network.

32. A method of simulating the operation of a process network having a set of physical plant elements through which mass flows including a plurality of junction nodes at which mass flow within the process network converges or diverges, comprising:

using a computer device to determine a grouped set of nodes for each of a plurality of base junction nodes within the process network, wherein a particular grouped set of nodes for a particular base junction node includes a set of selected junction nodes including the particular base junction node and one or more further junction nodes other than the particular base junction node, and a set of boundary nodes including nodes that are adjacent to one or more of the set of selected junction nodes, and wherein the set of selected junction nodes for the grouped set of nodes for the particular base junction node includes less than all of the junction nodes within the process network;

using one or more computer devices to iteratively solve for the pressure at each of the base junction nodes during each of a number of simulation cycles using a set of equations based on the grouped set of nodes determined for each base junction node to calculate the pressures at each of the base junction nodes;

using one or more computer devices to determine flows in the process network based on the pressure values determined for the base junction nodes during each simulation cycle; and wherein determining a grouped set of nodes for each of a plurality of base junction nodes within the process network includes selecting a fixed number of junction nodes to be placed in the grouped set of nodes for each of the plurality of base junction nodes.

33. The method of claim 32, wherein determining a grouped set of nodes for each of a plurality of base junction nodes within the process network includes selecting the further junction nodes to be placed in each of the grouped set of nodes for each of the plurality of base junction nodes based on the distance of a further junction node from a base junction node.

34. A simulation system for simulating the operation of a process network having a set of physical plant elements through which mass flows, wherein the process network includes a plurality of junction nodes at which flow converges or diverges, the plurality of junction nodes including a plurality of nodes identified as base junction nodes, the system comprising:

a multiplicity of processor implemented simulation modules stored on a computer memory, each of the multiplicity of simulation modules including a process model that models the operation of a different one of the physical plant elements to determine pressures at the different physical plant elements, and including a communication routine that communicates with other simulation modules to communicate the determined pressures, wherein each of the simulation modules includes;

a memory that stores a definition of a grouped set of nodes associated with a base junction node, the base junction node being one of the plurality of nodes identified as base junction nodes in the plurality junction nodes within the process network, the grouped set of nodes for the base junction node being less than all of the nodes of the process network and including: 1) a selected set of junction nodes including the base junction node and one or more further junction nodes that are adjacent to the base junction node, and 2) one or more boundary nodes that are adjacent to at least on of the one or more further junction nodes but not adjacent to the base junction node; and a routine that executes on a processor to iteratively solve for the pressure for the base junction node during each of a number of simulation cycles using a set of pressure and flow equations based on the grouped set of nodes for the base junction node to calculate the pressure at the base junction node, wherein, the routine iteratively solves for the pressure for the base junction node during a simulation cycle by performing a multiplicity of iterations, wherein during each iteration the routine sequentially solves for the pressure at each of the selected set of junction nodes of the grouped set of nodes for the base junction node using a previously calculated value for the pressures at the others of the selected set of junction nodes in the grouped set of nodes for the base junction node and using fixed values for the pressures at each of the boundary nodes of the grouped set of nodes for the base junction node, and determines a mass flow balance at one or more of the selected set of junction nodes using the calculated pressures to determine if flow balance is achieved at the one or more of the selected set of junction nodes; and wherein each of the simulation modules is executed during each simulation cycle.

35. The simulation system of claim 34, wherein the routine performs a multiplicity of iterations for the base junction node by continuing to perform a new iteration if flow balance is not achieved at the one or more of the selected set of junction nodes in a current iteration.

36. The simulation system of claim 34, wherein the routine performs a multiplicity of iterations for the base junction node by halting the performance of a new iteration when either a flow balance is achieved at the one or more of the selected set of junction nodes or a predetermined number of iterations has been performed during the simulation cycle.

37. The simulation system of claim 34, wherein the routine iteratively solves for the pressure for the base junction node during a simulation cycle by setting the pressures at each of the boundary nodes of the grouped set of nodes for the base junction node to fixed values that remain the same during each iteration of the simulation cycle.

38. The simulation system of claim 37, wherein the routine sets the pressures at each of the boundary nodes of the grouped set of nodes for the base junction node to fixed values by determining the fixed values as values previously calculated for the boundary nodes in a previous simulation cycle.

39. The simulation system of claim 34, further including a node determination routine stored on a memory that executes on a processor to determine the definition of a grouped set of nodes associated with a base junction node, wherein the node determining routine selects all nodes immediately upstream or downstream of each of the selected set of junction nodes as the boundary nodes for the grouped set of nodes for the base junction node.

40. The simulation system of claim 34, further including a node determination routine stored on a memory that executes on a processor to determine a condensed process network having multiple process elements in a single flow path of the process network combined into a composite process element and wherein the node determination routine uses the condensed process network to determine the definition of a grouped set of nodes for a base junction node within the process network.

41. The simulation system of claim 40, wherein the node determination routine determines a composite flow conductance for the composite process element based on a set of flow conductance values for each of the multiple process elements within the single flow path.

42. The simulation system of claim 34, wherein the simulation module includes a calibration routine that performs a pressure calibration technique for the base junction node during a first simulation cycle to develop a calibrated variable value for use in the next simulation cycle for the base junction node to calculate the pressure at the base junction node.

43. The simulation system of claim 42, wherein the calibration routine performs the pressure calibration technique for a base junction node by determining a calibrated flow conductance within an input flow path of the base junction node.

44. The simulation system of claim 43, wherein the calibration routine performs the pressure calibration technique when a flow balance summation at the base junction node is greater than a threshold value after iteratively solving for the pressure at the base junction node.

45. A simulation system for simulating the operation of a process network having a set of physical plant elements through which mass flows, wherein the process network includes a plurality of junction nodes at which flow converges or diverges, comprising:

a multiplicity of processor implemented simulation modules stored on a computer memory, each of the multiplicity of simulation modules including a process model that models the operation of a different one of the physical plant elements to determine pressures at the different physical plant elements, and including a communication routine that communicates with other simulation modules to communicate the determined pressures, wherein each of the simulation modules includes;

a memory that stores a definition of a grouped set of nodes associated with a base junction node, the base junction node being one of the junction nodes within the process network, the grouped set of nodes for the base junction node being less than all of the nodes of the process network and including 1) a selected set of junction nodes including the base junction node and one or more further junction nodes, and 2) one or more boundary nodes, the boundary nodes being nodes within the process network that are adjacent to at least one of the selected set of junction nodes;

a routine that executes on a processor to iteratively solve for the pressure for the base junction node during each of a number of simulation cycles using a set of pressure and flow equations based on the grouped set of nodes for the base junction node to calculate the pressure at the base junction node, wherein, the routine iteratively solves for the pressure for the base junction node during a simulation cycle by performing a multiplicity of iterations, wherein during each iteration the routine sequentially solves for the pressure at each of the selected set of junction nodes of the grouped set of nodes for the base junction node using a previously calculated value for the pressures at the others of the selected set of junction nodes in the grouped set of nodes for the base junction node and using fixed values for the pressures at each of the boundary nodes of the grouped set of nodes for the base junction node, and determines a mass flow balance at one or more of the selected set of junction nodes using the calculated pressures to determine if flow balance is achieved at the one or more of the selected set of junction nodes; and a node determination routine stored on a memory that executes on a processor to determine the definition of a grouped set of nodes associated with a base junction node, wherein the node determination routine selects a fixed number of junction nodes to be placed in the grouped set of nodes associated with a base junction node as the selected set of junction nodes for the base junction node.

46. The simulation system of claim 45, further including a node determination routine stored on a memory that executes on a processor to determine the definition of a grouped set of nodes associated with a base junction node, wherein the node determination routine selects the further junction nodes to be placed in the selected set of junction nodes for the grouped set of nodes based on the distance of a junction node from the base junction node within the process network.

* * * * *